(12) United States Patent
Fujimoto et al.

(10) Patent No.: US 11,407,217 B2
(45) Date of Patent: Aug. 9, 2022

(54) PRINTING DEVICE

(71) Applicant: YAMAHA HATSUDOKI KABUSHIKI KAISHA, Iwata (JP)

(72) Inventors: Takeshi Fujimoto, Iwata (JP); Kazuyuki Sugahara, Iwata (JP); Takeshi Miwa, Iwata (JP); Jinok Park, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 0 days.

(21) Appl. No.: 17/051,725

(22) PCT Filed: Jun. 5, 2018

(86) PCT No.: PCT/JP2018/021530
§ 371 (c)(1),
(2) Date: Oct. 29, 2020

(87) PCT Pub. No.: WO2019/234819
PCT Pub. Date: Dec. 12, 2019

(65) Prior Publication Data
US 2021/0122152 A1 Apr. 29, 2021

(51) Int. Cl.
B41F 15/40 (2006.01)
B41F 15/08 (2006.01)
B41F 15/44 (2006.01)
H05K 3/12 (2006.01)
H05K 3/34 (2006.01)

(52) U.S. Cl.
CPC .............. *B41F 15/40* (2013.01); *B41F 15/08* (2013.01); *B41F 15/44* (2013.01); *H05K 3/1216* (2013.01); *H05K 3/34* (2013.01); *H05K 2203/0139* (2013.01)

(58) Field of Classification Search
CPC . B41K 15/08; B41K 15/40; H05K 2203/0139
See application file for complete search history.

(56) References Cited

U.S. PATENT DOCUMENTS

| 9,050,790 B2 * | 6/2015 | Kawai ..................... B41F 15/44 |
| 2005/0268799 A1 | 12/2005 | Pham-Van-Diep et al. |
| 2014/0115874 A1 * | 5/2014 | Narita ..................... B41F 15/42 29/593 |

FOREIGN PATENT DOCUMENTS

| CN | 104411498 A | 3/2015 | |
| JP | 05-299812 | * 4/1992 | .............. B41F 15/08 |
| JP | H05-299812 A | 11/1993 | |
| JP | 2004-322383 A | 11/2004 | |

(Continued)

OTHER PUBLICATIONS

International Search Report issued in PCT/JP2018/021530; dated Jul. 10, 2018.

(Continued)

*Primary Examiner* — Matthew G Marini
*Assistant Examiner* — Marissa Ferguson-Samreth
(74) *Attorney, Agent, or Firm* — Studebaker & Brackett PC

(57) ABSTRACT

A printing device includes a coating material scooping unit configured to scoop a coating material on a mask, and a controller configured or programmed to determine whether or not the coating material scooping unit performs collecting operation to collect the coating material on the mask when the mask is replaced.

21 Claims, 16 Drawing Sheets

(56) References Cited

FOREIGN PATENT DOCUMENTS

| JP | 2011-201203 | * | 3/2010 | .............. B41F 15/08 |
| JP | 2011-201203 A | | 10/2011 | |
| JP | 5873928 B2 | | 3/2016 | |
| JP | 6699240 | * | 9/2017 | .............. B19C 67/00 |
| JP | 2020104450 | * | 7/2020 | .............. B41F 15/14 |
| WO | 2014033860 | * | 8/2012 | .............. B41F 15/08 |
| WO | 2014/033860 A1 | | 3/2014 | |
| WO | 2014033861 | * | 3/2014 | ........... H05K 3/1233 |

OTHER PUBLICATIONS

Written Opinion issued in PCT/JP2018/021530; dated Jul. 10, 2018.

An Office Action mailed by China National Intellectual Property Administration dated Jul. 29, 2021 which corresponds to Chinese Patent Application No. 201880093419.2 and is related to U.S. Appl. No. 17/051,725 with English language translation.

An Office Action; "Notice of Reasons for Refusal," mailed by the Japanese Patent Office dated Sep. 14, 2021, which corresponds to Japanese Patent Application No. 2020-523878 and is related to U.S. Appl. No. 17/051,725 with English translation.

An Office Action issued by the German Patent and Trade Mark Office dated May 17, 2022, which corresponds to German Patent Application No. 112018007698.9 and is related to U.S. Appl. No. 17/051,725; with English language translation.

* cited by examiner

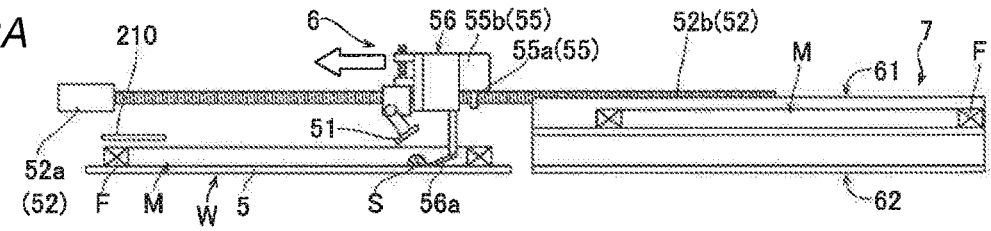
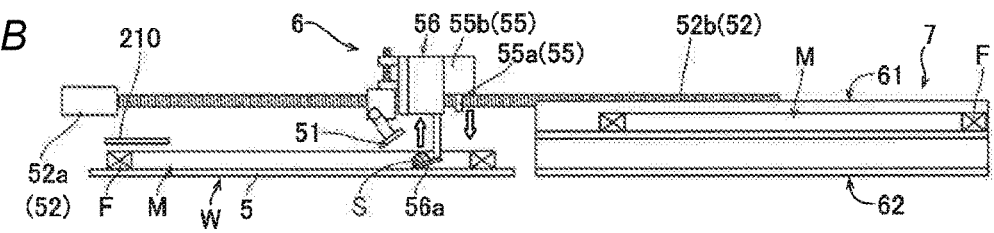
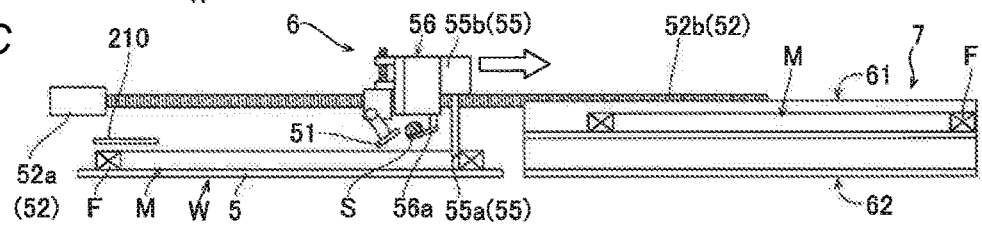
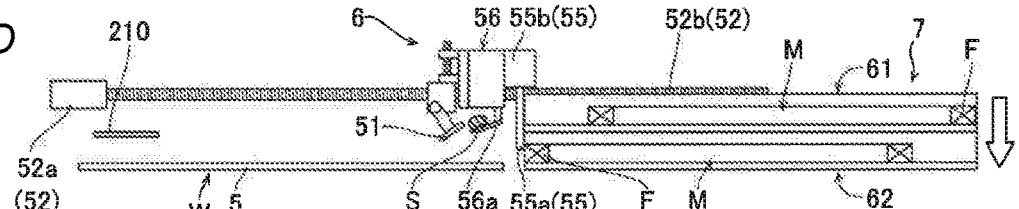
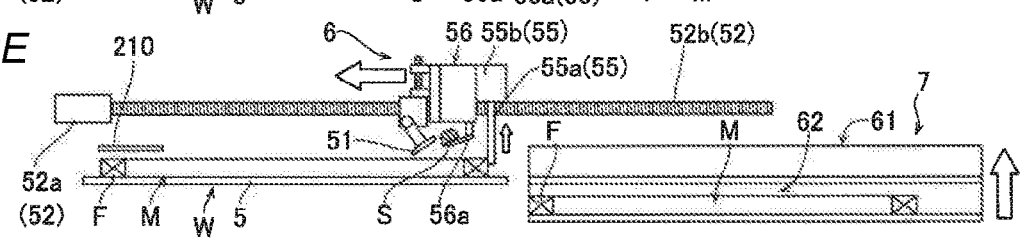
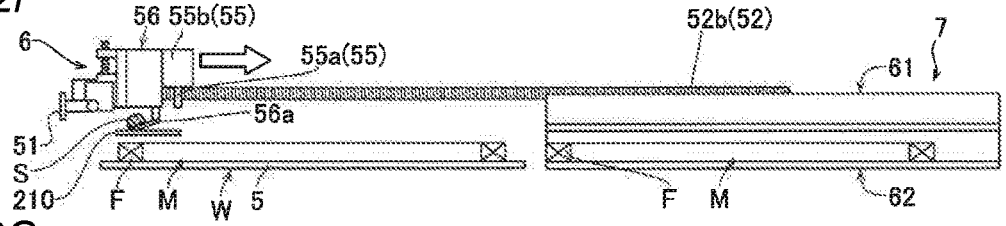
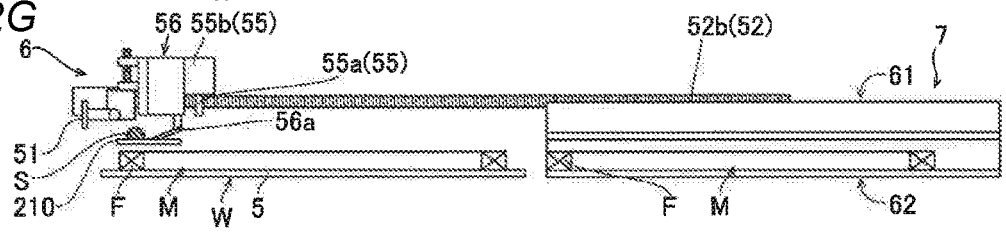

PRINTING DEVICE

CROSS-REFERENCE TO RELATED APPLICATION

This application is a National Stage of International Patent Application No. PCT/JP2018/021530, filed Jun. 5, 2018, the entire content of which is incorporated herein by reference.

BACKGROUND

Technical Field

The present disclosure relates to a printing device, and more particularly, it relates to a printing device including a coating material scooping unit configured to scoop a coating material on a mask.

Background Art

Conventionally, a printing device including a coating material scooping unit configured to scoop a coating material on a mask is known. Such a printing device is disclosed in Japanese Patent No. 5873928, for example.

Japanese Patent No. 5873928 discloses a printer (printing device) configured to print a cream solder on a surface of a printed board by moving the cream solder (coating material) on a mask with a squeegee. This printer includes a solder loading and unloading device (a coating material scooping unit) configured to scoop the cream solder on the mask.

SUMMARY

However, in the printer described in Japanese Patent No. 5873928, the solder loading and unloading device can scoop the cream solder on the mask, but the solder loading and unloading device cannot be appropriately controlled according to the situation when the mask is replaced.

Accordingly, the present disclosure provides a printing device capable of appropriately controlling a coating material scooping unit according to the situation when a mask is replaced.

A printing device according to an aspect of the present disclosure includes a squeegee configured to print, on a board, a coating material on a mask, a coating material scooping unit configured to scoop the coating material on the mask, and a controller configured or programmed to determine whether or not the coating material scooping unit performs collecting operation to collect the coating material on the mask used in current production of the board when the mask used in the current production of the board is replaced with the mask used in next production of the board.

The printing device according to this aspect of the present disclosure is configured as described above such that it is possible to determine whether or not the coating material on the mask is collected according to the situation when the mask is replaced, and thus the coating material collecting operation can be performed by the coating material scooping unit according to the situation when the mask is replaced. Consequently, it is possible to provide the printing device capable of appropriately controlling the coating material scooping unit according to the situation when the mask is replaced.

In the aforementioned printing device according to this aspect, the controller is preferably configured or programmed to determine whether or not the collecting operation is performed based on whether or not the coating material used in the current production of the board is used in the next production of the board. Accordingly, the coating material scooping unit can be more appropriately controlled according to the situation of whether or not the coating material used in the current production of the board is used in the next production of the board.

In this case, the controller is preferably configured or programmed to determine whether or not the coating material used in the current production of the board is used in the next production of the board based on at least one of a type of the coating material, an amount of the coating material, an expiration date of the coating material, a state of the coating material, a length of the coating material, or a length of the squeegee. Accordingly, the situation of whether or not the coating material used in the current production of the board is used in the next production of the board can be appropriately determined based on at least one of the type of the coating material, the amount of the coating material, the expiration date of the coating material, the state of the coating material, the length of the coating material, and the length of the squeegee.

In the aforementioned structure in which whether or not the collecting operation is performed is determined based on whether or not the coating material used in the current production of the board is used in the next production of the board, the collecting operation preferably includes operation of the coating material scooping unit to scoop and collect the coating material on the mask used in the current production of the board, and the controller is preferably configured or programmed to determine that scooping and collecting the coating material on the mask used in the current production of the board as the collecting operation is not performed by the coating material scooping unit when the coating material used in the current production of the board is not used in the next production of the board. Accordingly, the coating material scooping unit does not scoop the coating material unnecessarily, and thus the time required to replace the mask can be reduced accordingly.

In this case, the controller is preferably configured or programmed to determine that scooping and collecting the coating material on the mask used in the current production of the board as the collecting operation is performed by the coating material scooping unit when the coating material used in the current production of the board is used in the next production of the board, and the controller is preferably configured or programmed to control the coating material scooping unit to transfer, to the mask used in the next production of the board, the coating material that has been scooped when determining that the collecting operation is performed. Accordingly, when the coating material needs to be transferred, the coating material scooping unit is appropriately controlled such that the coating material can be transferred from the mask used in the current production of the board to the mask used in the next production of the board.

The aforementioned structure in which whether or not the collecting operation is performed is determined based on whether or not the coating material used in the current production of the board is used in the next production of the board preferably further includes a coating material placement portion configured to enable the coating material on the mask used in the current production of the board to be collected and allow the coating material on the mask used in the current production of the board to be placed thereon, the collecting operation preferably includes operation of the coating material scooping unit to scoop the coating material on the mask used in the current production of the board and place, on the coating material placement portion, the coating material that has been scooped to collect the coating material on the mask used in the current production of the board, and the controller is preferably configured or programmed to determine that scooping the coating material on the mask used in the current production of the board and placing, on the coating material placement portion, the coating material that has been scooped to collect the coating material on the mask used in the current production of the board as the collecting operation is performed by the coating material scooping unit when the coating material used in the current production of the board is not used in the next production of the board. Accordingly, the coating material can be temporarily placed on the coating material placement portion. Consequently, the temporarily placed coating material can be processed (a process to arrange the coating material on the mask for reuse or a process to discard the coating material can be performed) at the desired timing.

In this case, the controller is preferably configured or programmed to determine that scooping the coating material on the mask used in the current production of the board and placing, on the coating material placement portion, the coating material that has been scooped to collect the coating material on the mask used in the current production of the board as the collecting operation is not performed by the coating material scooping unit when the coating material used in the current production of the board is used in the next production of the board, and the controller is preferably configured or programmed to control the coating material scooping unit to scoop and transfer, to the mask used in the next production of the board, the coating material on the mask used in the current production of the board when determining that the collecting operation is not performed. Accordingly, when the coating material needs to be transferred, the coating material scooping unit is appropriately controlled such that the coating material can be transferred from the mask used in the current production of the board to the mask used in the next production of the board.

In the aforementioned structure further including the coating material placement portion, the controller is preferably configured or programmed to control the coating material scooping unit to scoop and transfer, onto the mask used in production of the board using the coating material on the coating material placement portion, the coating material on the coating material placement portion when the production of the board using the coating material on the coating material placement portion is performed. Accordingly, when the coating material is reused, the coating material on the coating material placement portion can be automatically transferred onto the mask by the coating material scooping unit. Consequently, it is possible to save the user the trouble of manually transferring the coating material to be reused onto the mask.

The printing device according to this aspect preferably further includes a mask replacer configured to perform replacement operation to replace the mask used in the current production of the board with the mask used in the next production of the board, and the controller is preferably configured or programmed to determine whether or not the collecting operation is performed before the replacement operation is performed. Accordingly, whether or not the collecting operation is performed before the replacement operation is performed is determined such that the coating material scooping unit can be appropriately controlled according to the situation when the mask is replaced.

In the aforementioned printing device according to this aspect, the controller is preferably configured or programmed to perform a control to notify a user that there is the coating material that is not used in the next production of the board. Accordingly, the user can collect the coating material that is not used in the next production of the board without forgetting the same.

In this case, the controller is preferably configured or programmed to perform a control to notify the user that the coating material that is not used in the next production of the board is the coating material to be reused or that the coating material that is not used in the next production of the board is the coating material to be discarded in addition to that there is the coating material that is not used in the next production of the board. Accordingly, the user can collect the coating material that is not used in the next production of the board without forgetting the same and know whether the collected coating material is the coating material to be reused or the coating material to be discarded. Consequently, the user can easily and reliably perform the next operation on the collected coating material.

According to the present disclosure, as described above, it is possible to provide the printing device capable of appropriately controlling the coating material scooping unit according to the situation when the mask is replaced.

BRIEF DESCRIPTION OF THE DRAWINGS

FIG. 12A to FIG. 12G are schematic views showing operation in a case in which the collecting operation is performed in the printing device according to the second embodiment;

DETAILED DESCRIPTION

Embodiments embodying the present disclosure are hereinafter described on the basis of the drawings.

First Embodiment

Figure 1:
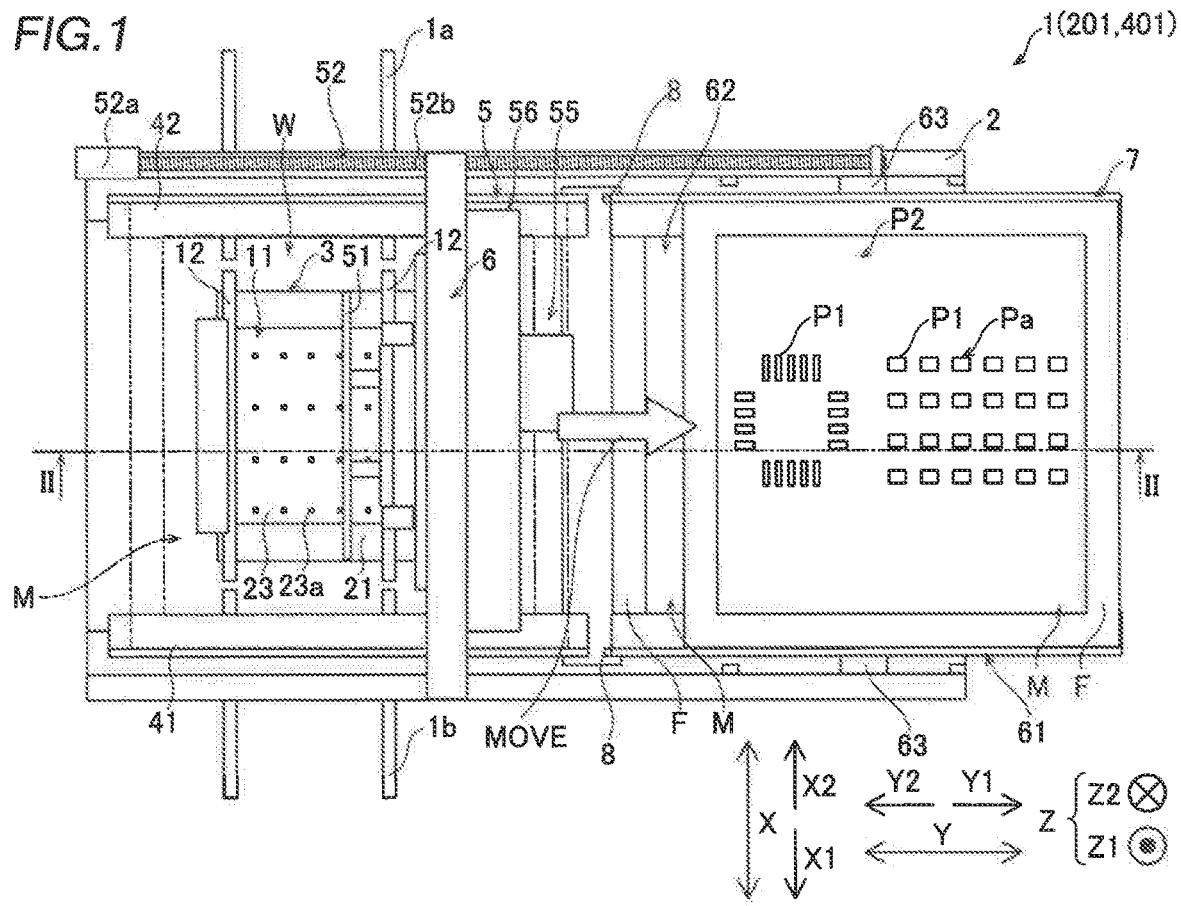
FIG. 1 is a schematic plan view showing the overall structure of a printing device according to first to third embodiments.

The structure of a printing device 1 according to a first embodiment of the present disclosure is now described with reference to FIGS. 1 to 7C. As shown in FIG. 1, the printing device 1 is a device that conveys a board B (see FIG. 2) in an X1 direction by a pair of conveyors 12 and prints a solder S (see FIGS. 6A to 6G) on the board B in a printing position. The board B is a printed board on which components (electronic components) are mounted. The solder S is a joining material for joining the components on the board B. In the following description, a direction (X1 direction) of conveyance of the board B by the pair of conveyors 12 (belt conveyors) and the opposite direction (X2 direction) are defined as an X direction, and a direction substantially orthogonal to the X direction in a horizontal direction is defined as a Y direction. Furthermore, a direction substantially orthogonal to the X direction and the Y direction is defined as a Z direction (upward-downward direction). The solder S is an example of a "coating material" in the claims.

The printing device 1 is configured to carry in the board B by carry-in conveyors 1a, perform a printing operation on a surface of the board B carried in with a printing pattern Pa formed on a mask M, and then carry out the board B on which the printing operation has been performed by carry-out conveyors 1b. The mask M has a rectangular flat plate shape in a plan view (as viewed from the Z1 direction side). The mask M includes a plurality of openings P1 that form the printing pattern Pa and a non-opening P2 that is a region other than the plurality of openings P1. Furthermore, a frame F is attached to the outer peripheral portion of the mask M. Note that FIGS. 1 to 3 show a state in which the mask M has been moved from an operation position W in which a printing operation is performed with the mask M to a mask replacement unit 7 described below.

Figure 2:
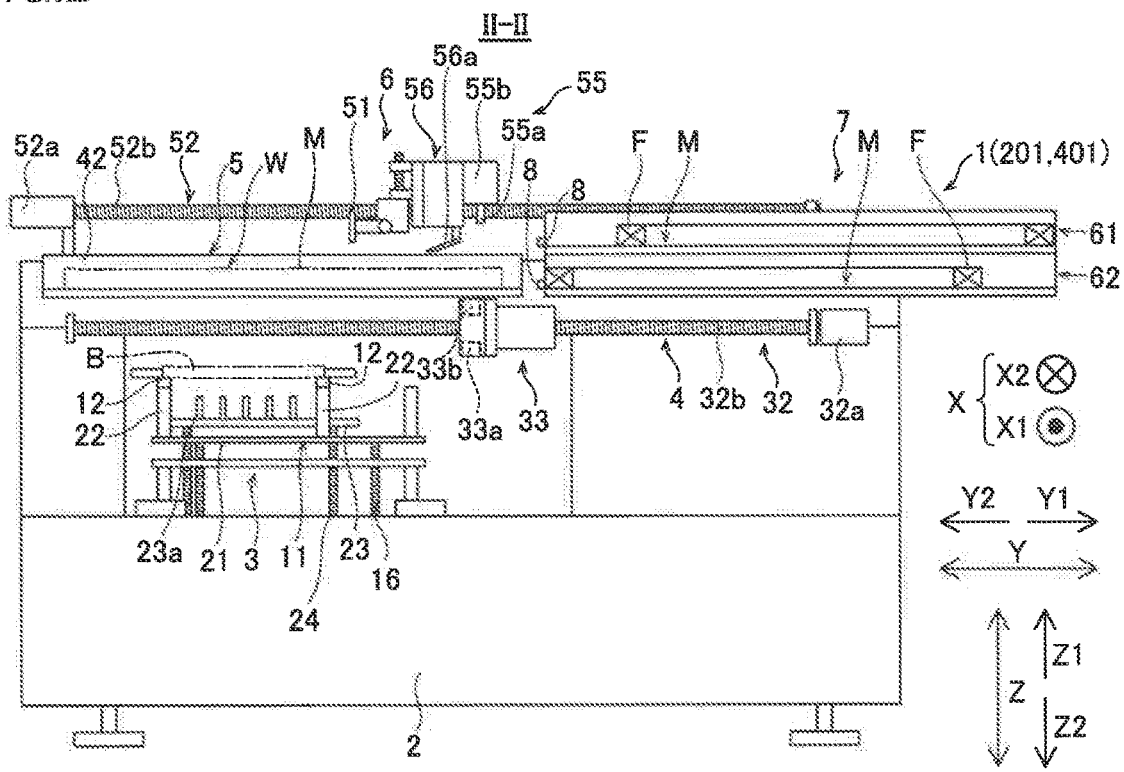
FIG. 2 is a schematic sectional view taken along the line II-II in FIG. 1.
Figure 3:
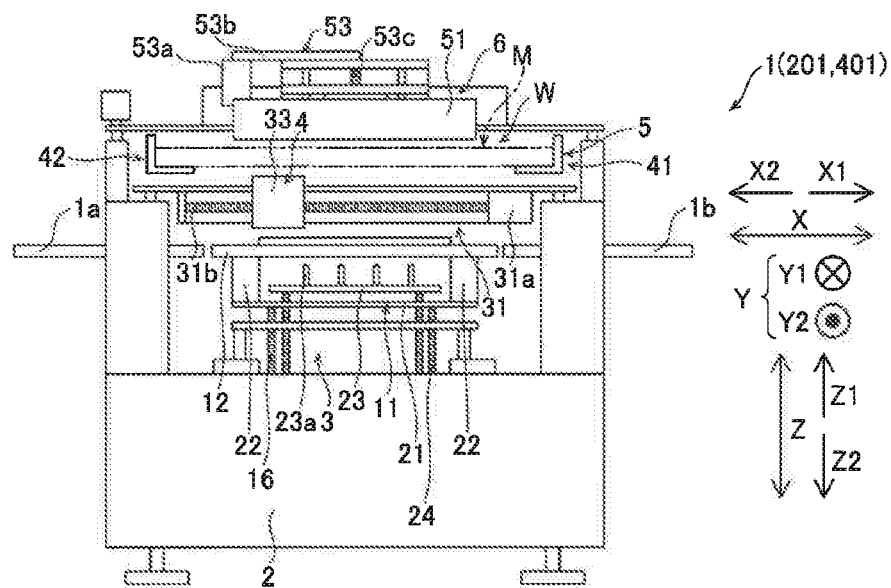
FIG. 3 is a schematic side view showing the overall structure of the printing device according to the first to third embodiments.
Figure 5:
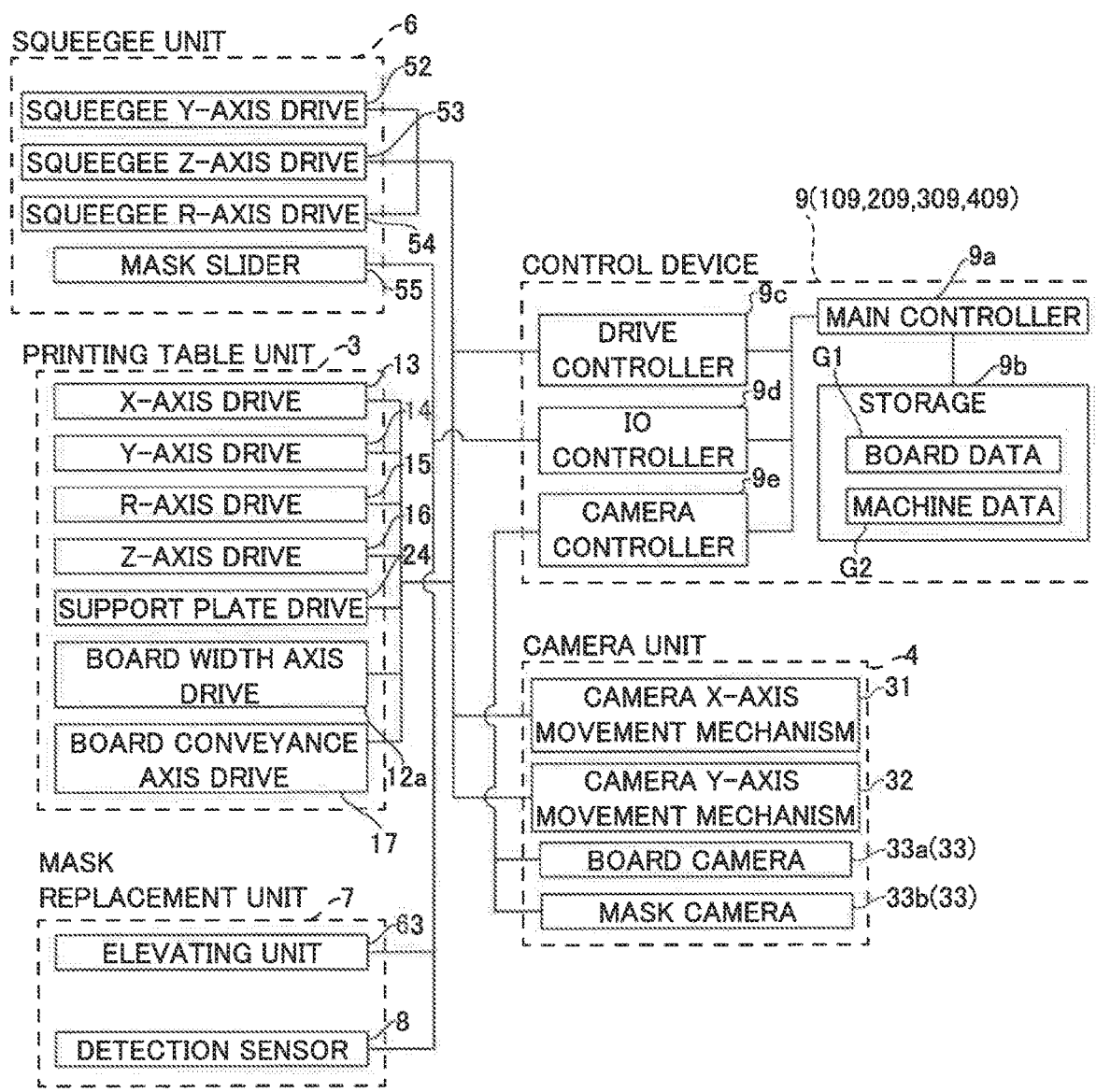
FIG. 5 is a block diagram showing the control structure of the printing device according to the first to third embodiments.

As shown in FIG. 2, the printing device 1 includes a base 2, a printing table unit 3, a camera unit 4, a mask clamp member 5, a squeegee unit 6, the mask replacement unit 7, detection sensors 8, and a control device 9 (see FIG. 5). The control device 9 is an example of a "controller" in the claims.

The printing table unit 3 is provided on the base 2, and is configured to hold the board B and align the board B with respect to the mask M. Specifically, the printing table unit 3 includes an X-axis movement mechanism (not shown), a Y-axis movement mechanism (not shown), an R-axis movement mechanism (not shown), a Z-axis movement mechanism (not shown), a printing table 11, and the pair of conveyors 12 (see FIG. 1).

The X-axis movement mechanism includes an X-axis drive 13 (see FIG. 5) as a drive source to move the printing table 11 in the X direction. The Y-axis movement mechanism includes a Y-axis drive 14 (see FIG. 5) as a drive source to move the printing table 11 in the Y direction. The R-axis movement mechanism includes an R-axis drive 15 (see FIG. 5) as a drive source to rotate the printing table 11 about a rotation axis that extends in the Z direction. The Z-axis movement mechanism includes a Z-axis drive 16 (see FIG. 5) as a drive source to move the printing table 11 in the Z direction.

The printing table 11 includes a table body 21, a pair of bracket members 22 provided on the table body 21, a support plate 23 on which a plurality of backup pins 23a are arranged, and a support plate drive 24 configured to move the support plate 23 in the Z direction. The conveyor 12 (see FIG. 1) is provided on each of upper portions of the pair of bracket members 22. The backup pins 23a are configured to support the board B from below by movement of the support plate 23 in a Z1 direction (upward direction) by the support plate drive 24.

As shown in FIG. 1, the pair of conveyors 12 are provided so as to extend along the X direction. The pair of conveyors 12 are arranged parallel to each other with a predetermined distance in the Y direction. Furthermore, an interval between the pair of conveyors 12 in the Y direction can be adjusted according to the width of the board B to be conveyed. Specifically, a board width axis drive 12a (see FIG. 5) is configured to adjust the interval (width) between the pair of conveyors 12 in the Y direction.

The camera unit 4 is configured to image the mask M and the board B, as shown in FIGS. 2 and 3. Specifically, the camera unit 4 includes a camera X-axis movement mechanism 31, a camera Y-axis movement mechanism 32, and an imager 33 including a board camera 33a and a mask camera 33b. The camera X-axis movement mechanism 31 includes an X-axis motor 31a and a ball screw 31b that extends in the X direction. The camera Y-axis movement mechanism 32 includes a Y-axis motor 32a and a ball screw 32b that extends in the Y direction. The board camera 33a is configured to image the board B and recognize the relative position of the board B with respect to the printing table 11. The mask camera 33b is configured to image the mask M and recognize the position of the mask M.

Thus, in the printing device 1, after the relative position of the board B with respect to the mask M is recognized using the board camera 33a and the mask camera 33b, the board B is accurately positioned (the position and inclination in a horizontal plane) relative to the mask M by the X-axis movement mechanism, the Y-axis movement mechanism, and the R-axis movement mechanism of the printing table unit 3. Then, in the printing device 1, the board B is raised by the Z-axis movement mechanism of the printing table unit 3, and is brought into contact with the lower surface of the mask M in a state in which the board B is accurately positioned relative to the mask M.

As shown in FIG. 3, the mask clamp member 5 is configured to hold the mask M in the operation position W when the solder S is printed in the printing pattern Pa on the board B using the mask M. Specifically, the mask clamp member 5 includes a first mask holder 41 configured to hold an end of the mask M on the X1 direction side, a second mask holder 42 configured to hold an end of the mask M on the X2 direction side, and a pressing portion (not shown) provided on the first mask holder 41 and configured to press the mask M in the X2 direction.

As shown in FIGS. 2 and 3, the squeegee unit 6 is configured to reciprocate in the Y direction to move the solder S supplied onto the upper surface of the mask M while scraping the solder S along the upper surface of the mask M. Specifically, the squeegee unit 6 includes a squeegee 51, a squeegee Y-axis drive 52 that moves the squeegee 51 in a printing direction (Y direction), a squeegee Z-axis drive 53 that moves the squeegee 51 in the upward-downward direction (Z direction), and a squeegee R-axis drive 54 (see FIG. 5) that rotates the squeegee 51 about a rotation axis that extends in the X direction.

The squeegee 51 extends in the X direction. The squeegee 51 is configured to print the solder S supplied to the mask M while applying a predetermined printing pressure (load) to the mask M. The squeegee Y-axis drive 52 includes a Y-axis motor 52a and a ball screw 52b that extends in the Y direction. The squeegee Z-axis drive 53 includes a Z-axis motor 53a, a belt 53b, and a ball screw 53c that extends in the Z direction.

The squeegee unit 6 includes a mask slider 55 that slides the mask M in the Y direction and performs replacement operation to replace the mask M, as shown in FIG. 2. A single mask slider 55 is arranged in the squeegee unit 6. The mask slider 55 includes a slide portion 55a that is movable in the Z direction (upward-downward direction) and a housing 55b that houses the slide portion 55a. The mask slider 55 includes an air cylinder, for example, the slide portion 55a includes a rod of the air cylinder, and the housing 55b includes a cylinder of the air cylinder. The mask slider 55 is an example of a "mask replacer" in the claims.

The mask slider 55 is configured to move integrally in the Y direction by movement of the squeegee 51 in the Y direction by the squeegee Y-axis drive 52. In the mask slider 55, the slide portion 55a moves in a Z2 direction (downward direction) so as to protrude from the housing 55b to a position in which the slide portion 55a can contact the frame F of the mask M in the operation position W in the horizontal direction (Y direction). In the mask slider 55, the slide portion 55a moves in the Z1 direction (upward direction) to a position in which the slide portion 55a does not contact the frame F of the mask M in the operation position W in the horizontal direction (Y direction) so as to be housed in the housing 55b.

Thus, the squeegee 51 and the mask slider 55 are integrally provided in the squeegee unit 6. The squeegee 51 and the mask slider 55 are integrally moved in the Y direction by movement of the squeegee unit 6. The slide portion 55a of the mask slider 55 contacts the frame F of the mask M from the Y1 direction side or the Y2 direction side and moves the mask M in a Y1 direction or a Y2 direction.

The squeegee unit 6 includes a solder scooping unit 56 that scoops the solder S on the mask M. The solder scooping unit 56 includes a scoop 56a configured to scoop and hold the solder S on the mask M. The scoop 56a is configured to be movable in the Z direction (upward-downward direction) between a lowered position for scooping the solder S on the mask M or unloading the scooped solder S onto the mask M, and a raised position for not scooping the solder S on the mask M. The solder scooping unit 56 is configured to move integrally in the Y direction by movement of the squeegee 51 in the Y direction by the squeegee Y-axis drive 52. The solder scooping unit 56 scoops and holds, on the scoop 56a, the solder S on the mask M by moving in the Y2 direction in a state in which the scoop 56a is arranged in the lowered position. Furthermore, the solder scooping unit 56 unloads the scooped solder S from the scoop 56a onto the mask M by moving in the Y1 direction in a state in which the scoop 56a is arranged in the lowered position. The solder scooping unit 56 is an example of a "coating material scooping unit" in the claims.

Figure 4A:
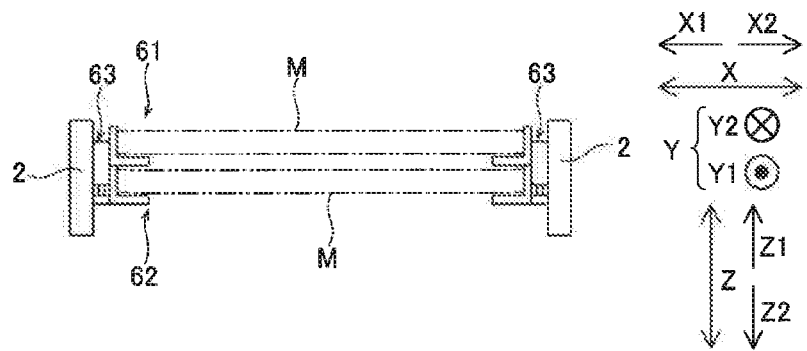
FIG. 4A is a schematic view showing a state in which a mask replacement unit has been raised.
Figure 4B:
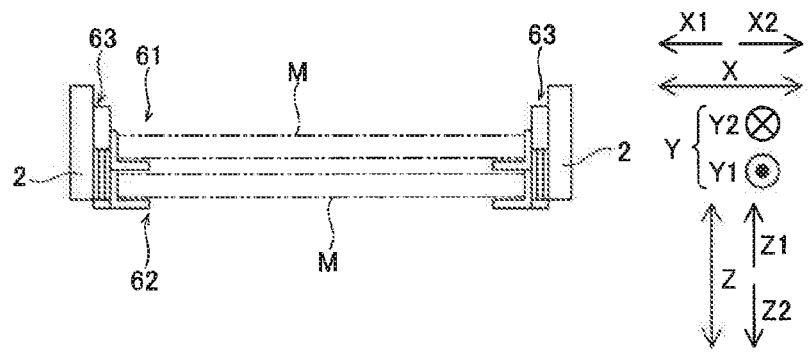
FIG. 4B is a schematic view showing a state in which the mask replacement unit has been lowered.

As shown in FIGS. 4A and 4B and FIG. 5, the mask replacement unit 7 is configured to store a plurality of (two) masks M. Specifically, the mask replacement unit 7 includes a first storage 61, a second storage 62, and an elevating unit 63. The first storage 61 and the second storage 62 are each configured to store one mask M. The first storage 61 and the second storage 62 are aligned in the upward-downward direction. The first storage 61 is an upper storage arranged above the second storage 62. The second storage 62 is a lower storage arranged below the first storage 61. The elevating unit 63 is configured to move the first storage 61 and the second storage 62 in the upward-downward direction. In the mask replacement unit 7, the elevating unit 63 is attached to the base 2. In the mask replacement unit 7, the second storage 62 is attached to the elevating unit 63. In the mask replacement unit 7, the first storage 61 is attached to the second storage 62. Thus, the first storage 61 and the second storage 62 are integrally moved up and down as the elevating unit 63 moves up and down. The first storage 61 and the second storage 62 are configured to be movable in the Z direction (upward-downward direction) between a lowered position for loading and unloading the mask M into and from the first storage 61 and a raised position for loading and unloading the mask M into and from the second storage 62.

As shown in FIG. 2, the detection sensors 8 are configured to detect the mask M in a state of straddling the mask clamp member 5 and the mask replacement unit 7. The detection sensor 8 is provided on each of the first storage 61 and the second storage 62. Specifically, the detection sensor 8 provided on the first storage 61 is configured to detect the mask M stopped in a state of straddling the mask clamp member 5 and the first storage 61 when the mask M is moved between the operation position W and the first storage 61. The detection sensor 8 provided on the second storage 62 is configured to detect the mask M stopped in a state of straddling the mask clamp member 5 and the second storage 62 when the mask M is moved between the operation position W and the second storage 62. The detection sensors 8 are transmissive sensors, for example, and each include a projector (not shown) that emits light and a light receiver (not shown) that receives the light emitted from the projector.

As shown in FIG. 5, the control device 9 includes a main controller 9a, a storage 9b, a drive controller 9c, an IO controller 9d, and a camera controller 9e. The main controller 9a includes a central processing unit (CPU). The storage 9b includes a read-only memory (ROM), a random access memory (RAM), etc., and stores board data G1, machine data G2, and a printing program. The main controller 9a has a function of controlling each unit of the printing device 1 based on the printing program stored in the storage 9b. The board data G1 includes information about the type of the board B, information about the size of the board B, information about the mask M corresponding to the type of the board B, information about the number of boards on which the solder S is to be printed for each type of the board B, etc. The machine data G2 includes information about a movement limit position of the squeegee unit 6 in the Y direction, information about movement limit positions of the camera unit 4 in the X and Y directions, etc.

The main controller 9a is configured or programmed to control the squeegee unit 6 by the drive controller 9c. Specifically, the drive controller 9c controls driving of the squeegee Y-axis drive 52, the squeegee Z-axis drive 53, and the squeegee R-axis drive 54 to move the squeegee 51 in the Y and Z directions and rotate the squeegee 51 about the rotation axis that extends in the X direction.

The main controller 9a is configured or programmed to control the printing table unit 3 by the drive controller 9c. Specifically, the main controller 9a drives the X-axis drive 13, the Y-axis drive 14, the R-axis drive 15, and the Z-axis drive 16 by the drive controller 9c to move the board B in the X-direction, the Y-direction, and the Z-direction and rotate the board B about the rotation axis that extends in the Z direction. Furthermore, the main controller 9a drives the support plate drive 24 by the drive controller 9c to move the support plate 23 so as to move the backup pins 23a in the Z direction (upward-downward direction). The main controller 9a drives the board width axis drive 12a by the drive controller 9c to adjust the interval (width) between the pair of conveyors 12 in the Y direction. In addition, the main controller 9a drives a board conveyance axis drive 17 by the drive controller 9c to convey the board B in the X direction.

The main controller 9a is configured or programmed to control the camera unit 4 by the drive controller 9c. Specifically, the main controller 9a drives the camera X-axis movement mechanism 31 and the camera Y-axis movement mechanism 32 by the drive controller 9c to move the imager 33 (the board camera 33a and the mask camera 33b) in the X and Y directions.

The main controller 9a is configured or programmed to control the camera unit 4 by the camera controller 9e. Specifically, the main controller 9a controls the board B imaging operation of the board camera 33a by the camera controller 9e. The main controller 9a controls the mask M imaging operation of the mask camera 33b by the camera controller 9e.

The main controller 9a is configured or programmed to control the squeegee unit 6 by the IO controller 9d. Specifically, the main controller 9a controls the moving up and down operation of the slide portion 55a of the mask slider 55 by the IO controller 9d.

The main controller 9a is configured or programmed to control the mask replacement unit 7 by the IO controller 9d. Specifically, the main controller 9a controls the elevating operation of the elevating unit 63 to move the first storage 61 and the second storage 62 of the mask replacement unit 7 up and down by the IO controller 9d. Furthermore, the main controller 9a is configured or programmed to receive a detection signal of the detection sensor 8 via the IO controller 9d when the detection sensor 8 detects the mask M stopped in a state of straddling the mask clamp member 5 and the first storage 61. The main controller 9a is configured or programmed to receive a detection signal of the detection sensor 8 via the IO controller 9d when the detection sensor 8 detects the mask M stopped in a state of straddling the mask clamp member 5 and the second storage 62.

Structure of Collection of Solder at Time of Replacing Mask M

In the first embodiment, as shown in FIGS. 6A to 6G and FIGS. 7A to 7C, the control device 9 is configured or programmed to determine whether or not the solder scooping unit 56 performs collecting operation to collect the solder S (solder roll) on the mask M used in the current production of the board B when the mask M used in the current production of the board B is replaced with the mask M used in the next production of the board B. The control device 9 is configured or programmed to determine whether or not the collecting operation is performed before the replacement operation of the mask slider 55 to replace the mask M. In the first embodiment, the collecting operation includes the operation of the solder scooping unit 56 to scoop and collect the solder S on the mask M used in the current production of the board B. FIGS. 6A to 6G and FIG. 7A to 7C each show an example in which the mask M stored in the second storage 62 is the mask M used in the current production of the board B, and the mask M stored in the first storage 61 is the mask M used in the next production of the board B for the convenience of illustration.

The control device 9 is configured or programmed to determine whether or not the collecting operation is performed based on whether or not the solder S used in the current production of the board B is used in the next production of the board B. Specifically, the control device 9 is configured or programmed to determine whether or not the solder S used in the current production of the board B is used in the next production of the board B based on the type of the solder S, the amount of solder S, the expiration date of the solder S, the state of the solder S, the length of the solder S, and the length of the squeegee 51. As shown in FIGS. 6A to 6G, the control device 9 is configured or programmed to determine that scooping and collecting the solder S on the mask M used in the current production of the board B as the collecting operation is performed by the solder scooping unit 56 when the solder S used in the current production of the board B is used in the next production of the board B. The control device 9 is configured or programmed to control the solder scooping unit 56 to perform the collecting operation and transfer the solder S scooped in the collecting operation to the mask M used in the next production of the board B when determining that the collecting operation is performed.

Figure 6A:
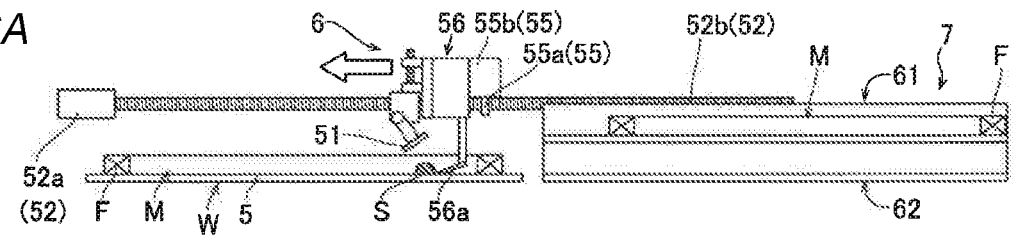
FIG. 6A to FIG. 6G are schematic views showing operation in a case in which collecting operation is performed in the printing device according to the first embodiment.
Figure 6B:
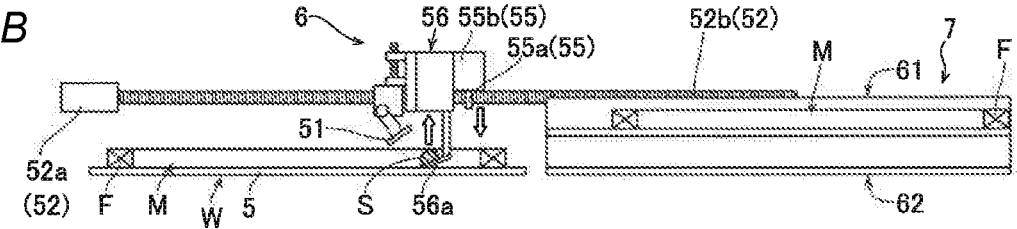
Figure 6C:
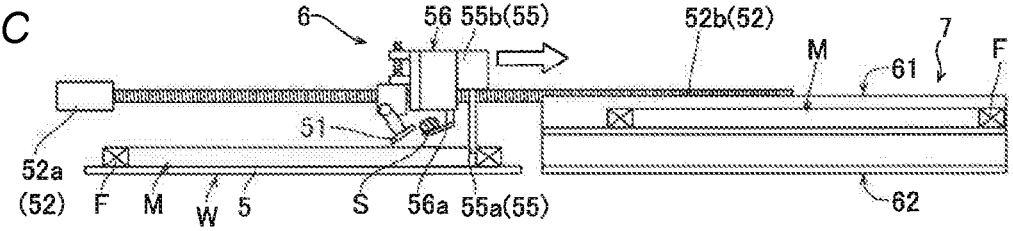

Specifically, first, as shown in FIG. 6A, the control device 9 controls the solder scooping unit 56 to lower the scoop 56a of the solder scooping unit 56 to the lowered position on the mask M used in the current production of the board B, which is arranged in the operation position W. Then, as shown in FIG. 6B, the control device 9 controls the solder scooping unit 56 to move in the Y2 direction (a direction in which the solder S is scooped) in a state in which the scoop 56a is arranged in the lowered position. Thus, the solder S on the mask M used in the current production of the board B is moved and held on the scoop 56a of the solder scooping unit 56. Then, as shown in FIG. 6C, the control device 9 controls the solder scooping unit 56 to raise the scoop 56a of the solder scooping unit 56 that holds the solder S to the raised position. Thus, the solder scooping unit 56 scoops and collects the solder S on the mask M used in the current production of the board B.

Figure 6D:
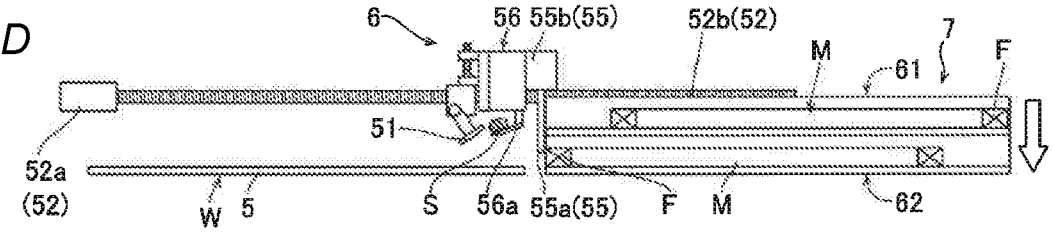
Figure 6E:
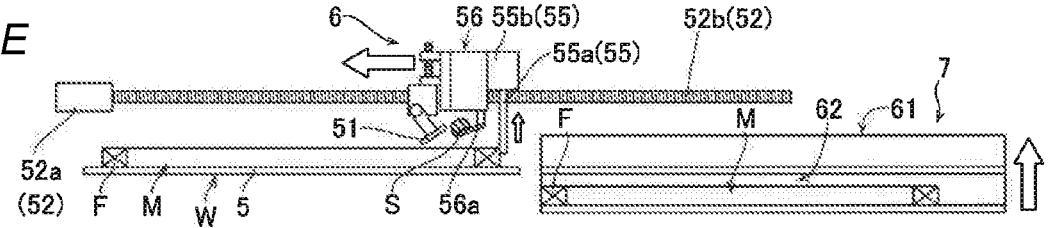

Then, as shown in FIGS. 6C and 6D, the control device 9 controls the mask slider 55 to move the mask M used in the current production of the board B from the operation position W (mask clamp member 5) to the second storage 62 of the mask replacement unit 7. Then, when the mask M used in the current production of the board B is stored in the second storage 62, the control device 9 controls the mask replacement unit 7 to lower the first storage 61 and the second storage 62 of the mask replacement unit 7 to the lowered position. Then, as shown in FIG. 6E, the control device 9 controls the mask slider 55 to move the mask M used in the next production of the board B from the first storage 61 of the mask replacement unit 7 to the operation position W (mask clamp member 5). Thus, the mask M used in the current production of the board B is replaced with the mask M used in the next production of the board B.

Figure 6F:
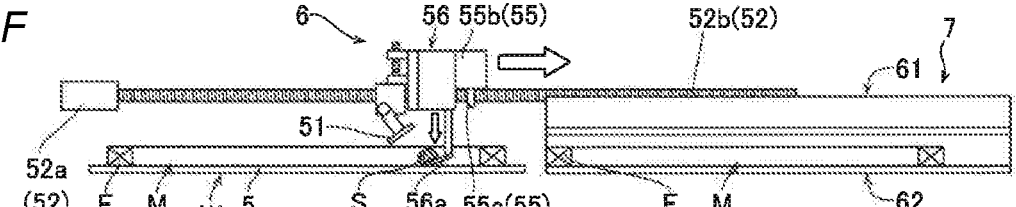
Figure 6G:
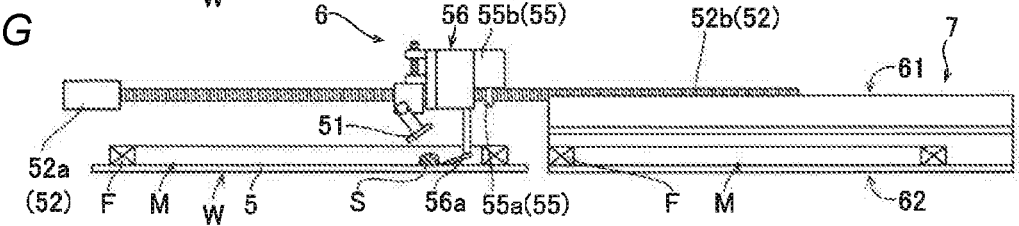

Then, when the mask M used in the next production of the board B is arranged in the operation position W (mask clamp member 5), the control device 9 controls the mask replacement unit 7 to raise the first storage 61 and the second storage 62 of the mask replacement unit 7 to the raised position. Then, as shown in FIG. 6F, the control device 9 controls the solder scooping unit 56 to lower the scoop 56a of the solder scooping unit 56 to the lowered position on the mask M used in the next production of the board B arranged in the operation position W. Then, as shown in FIG. 6G, the control device 9 controls the solder scooping unit 56 to move in the Y1 direction (a direction in which the solder S is unloaded) in a state in which the scoop 56a is arranged in the lowered position. Thus, the solder S on the scoop 56a of the solder scooping unit 56 is transferred onto the mask M used in the next production of the board B.

Figure 7A:
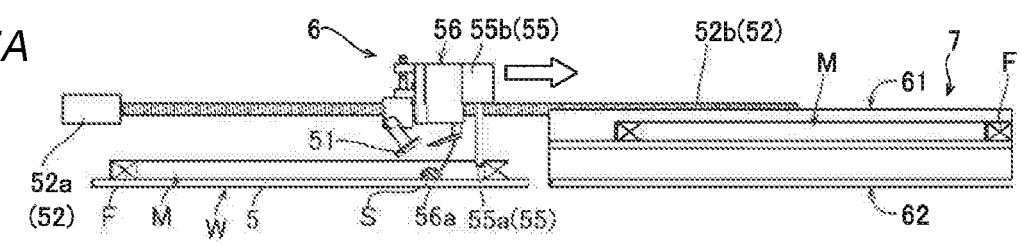
FIG. 7A to FIG. 7C are schematic views showing operation in a case in which the collecting operation is not performed in the printing device according to the first embodiment.
Figure 7B:
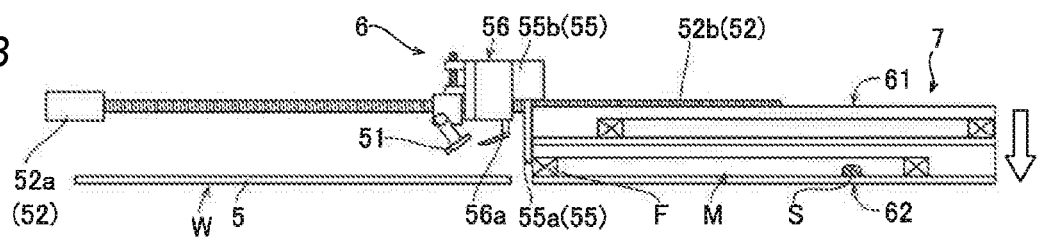
Figure 7C:
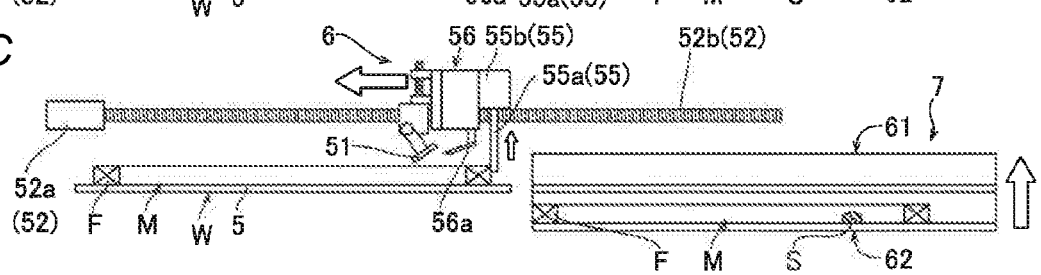

In the first embodiment, as shown in FIGS. 7A to 7C, the control device 9 is configured or programmed to determine that scooping and collecting the solder S on the mask M used in the current production of the board B as the collecting operation is not performed by the solder scooping unit 56 when the solder S used in the current production of the board B is not used in the next production of the board B. In this case, the control device 9 controls the mask slider 55 to replace the mask M without causing the solder scooping unit 56 to scoop and collect the solder S on the mask M used in the current production of the board B.

Specifically, first, as shown in FIGS. 7A and 7B, the control device 9 controls the mask slider 55 to move the mask M used in the current production of the board B from the operation position W (mask clamp member 5) to the second storage 62 of the mask replacement unit 7 without causing the solder scooping unit 56 to scoop and collect the solder S on the mask M used in the current production of the board B. Thus, the mask M used in the current production of the board B is stored in the second storage 62 of the mask replacement unit 7 in a state in which the solder S used in the current production of the board B is arranged. Then, when the mask M used in the current production of the board B is stored in the second storage 62, the control device 9 controls the mask replacement unit 7 to lower the first storage 61 and the second storage 62 of the mask replacement unit 7 to the lowered position.

Then, as shown in FIG. 7C, the control device 9 controls the mask slider 55 to move the mask M used in the next production of the board B from the first storage 61 of the mask replacement unit 7 to the operation position W (mask clamp member 5). Thus, the mask M used in the current production of the board B is replaced with the mask M used in the next production of the board B. Then, when the mask M used in the next production of the board B is arranged in the operation position W (mask clamp member 5), the control device 9 controls the mask replacement unit 7 to raise the first storage 61 and the second storage 62 of the mask replacement unit 7 to the raised position.

In the first embodiment, the control device 9 is configured or programmed to control the storage 9b to store information that the solder S not used in the next production of the board B is on the mask M used in the current production of the board B when the collecting operation is not performed. The control device 9 is configured or programmed to perform a control to notify a user (operator) that the solder S not used in the next production of the board B is on the mask M used in the current production of the board B based on the information stored in the storage 9b. At this time, the control device 9 is configured or programmed to perform a control to notify the user that the solder S not used in the next production of the board B is the solder S to be reused or that the solder S not used in the next production of the board B is the solder S to be discarded in addition to that the solder S not used in the next production of the board B is on the mask M used in the current production of the board B. Based on the information of which the user is notified, the user collects the solder S not used in the next production of the board B on the mask M used in the current production of the board B, and stores the same for reuse or discards the same.

Solder Collection Determination Process

Figure 8:
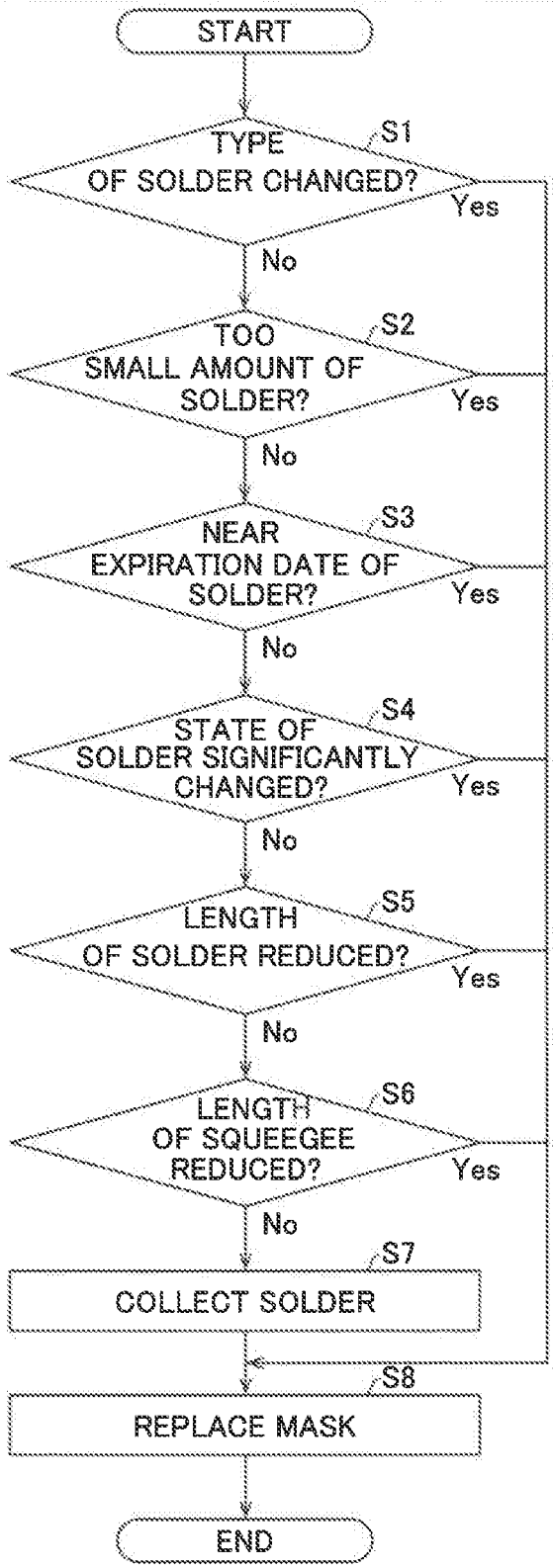
FIG. 8 is a flowchart for illustrating a solder collection determination process performed by the printing device according to the first embodiment.

A solder collection determination process performed by the printing device 1 according to the first embodiment is now described based on a flowchart with reference to FIG. 8. Each process operation of the flowchart is performed by the control device 9.

As shown in FIG. 8, first, in step S1, it is determined whether or not the type of the solder S is changed between the current production of the board B and the next production of the board B. Whether or not the type of the solder S is changed is determined based on a comparison between information about the solder S of the printing program used in the current production of the board B and information about the solder S of the printing program used in the next production of the board B, for example. When it is determined that the type of the solder S is not changed, the solder S on the mask M used in the current production of the board B can be used in the next production of the board B, and thus the process advances to step S2.

Then, in step S2, it is determined whether or not the amount of solder S on the mask M used in the current production of the board B is too small. For example, whether or not the amount of solder S is too small is determined based on a comparison between the amount of solder S on the mask M used in the current production of the board B and a predetermined threshold. Furthermore, for example, whether or not the amount of solder S is too small is determined based on a comparison between the amount of solder S consumed in the current production of the board B and a predetermined threshold. When it is determined that the amount of solder S is not too small, the solder S on the mask M used in the current production of the board B can be used in the next production of the board B, and thus the process advances to step S3.

Then, in step S3, it is determined whether or not the expiration date of the solder S on the mask M used in the current production of the board B is near. For example, whether or not the expiration date of the solder S is near is determined based on a comparison between the elapsed time from the start of use of the solder S on the mask M used in the current production of the board B and a predetermined threshold. Furthermore, for example, whether or not the expiration date of the solder S is near is determined based on a comparison between the remaining time until the expiration date of the solder S on the mask M used in the current production of the board B and a predetermined threshold. When it is determined that the expiration date of the solder S is not near, the solder S on the mask M used in the current production of the board B can be used in the next production of the board B, and thus the process advances to step S4.

Then, in step S4, it is determined whether or not the state (such as the viscosity) of the solder S on the mask M used in the current production of the board B is significantly changed. For example, whether or not the state of the solder S is significantly changed is determined based on a comparison between the viscosity of the solder S on the mask M used in the current production of the board B and a predetermined threshold. When it is determined that the state of the solder S is not significantly changed, the solder S on the mask M used in the current production of the board B can be used in the next production of the board B, and thus the process advances to step S5.

Then, in step S5, it is determined whether or not the length of the solder S in the X direction (the length of the solder S restricted by the squeegee 51 or the like in the X direction) is reduced between the current production of the board B and the next production of the board B. Whether or not the length of the solder S in the X direction is reduced is determined based on a comparison between information about the squeegee 51 of the printing program used in the current production of the board B and information about the squeegee 51 of the printing program used in the next production of the board B, for example. It is determined that the length of the solder S in the X direction is reduced when the length of the squeegee 51 in the X direction is reduced between the current production of the board B and the next production of the board B. Alternatively, it is determined that the length of the solder S in the X direction is reduced when a side leakage prevention component of a sliding side leakage prevention squeegee is slid such that the length of the solder S in the X direction is reduced when the squeegee 51 is the sliding side leakage prevention squeegee. When it is determined that the length of the solder S in the X direction is not reduced, the solder S on the mask M used in the current production of the board B can be used in the next production of the board B, and thus the process advances to step S6.

Then, in step S6, it is determined whether or not the length of the squeegee 51 in the X direction is reduced between the current production of the board B and the next production of the board B. Whether or not the length of the squeegee 51 in the X direction is reduced is determined based on a comparison between the information about the squeegee 51 of the printing program used in the current production of the board B and the information about the squeegee 51 of the printing program used in the next production of the board B, for example. When it is determined that the length of the squeegee 51 in the X direction is not reduced, the solder S on the mask M used in the current production of the board B can be used in the next production of the board B, and thus the process advances to step S7.

Then, in step S7, the solder scooping unit 56 scoops and collects the solder S on the mask M used in the current production of the board B.

Then, in step S8, the mask slider 55 replaces the mask M used in the current production of the board B with the mask M used in the next production of the board B.

After that, as operation to supply the solder S onto the mask M used in the next production of the board B, the solder S scooped by the solder scooping unit 56 in step S7 is transferred to the mask M used in the next production of the board B, and the solder collection determination process is terminated.

When it is determined in step S1 that the type of the solder S is changed, when it is determined in step S2 that the amount of solder S is too small, when it is determined in step S3 that the expiration date of the solder S is near, when it is determined in step S4 that the state of the solder S is significantly changed, when it is determined in step S5 that the length of the solder S in the X direction is reduced, or when it is determined in step S6 that the length of the squeegee 51 in the X direction is reduced, the solder S used in the current production of the board B is not used in the next production of the board B, and thus the process advances to step S8 without performing a process operation (a process operation to collect the solder) in step S7.

Then, in step S8, the mask slider 55 replaces the mask M used in the current production of the board B with the mask M used in the next production of the board B. Then, the solder collection determination process is terminated. When the process does not go through step S7, the user supplies the solder S onto the mask M used in the next production of the board B, for example.

When it is determined in step S1 that the type of the solder S is changed, when it is determined in step S2 that the amount of solder S is too small, when it is determined in step S5 that the length of the solder S in the X direction is reduced, or when it is determined in step S6 that the length of the squeegee 51 in the X direction is reduced, the solder S used in the current production of the board B can be reused. Therefore, in these cases, the solder S not used in the next production of the board B is on the mask M used in the current production of the board B, and the user is notified that the solder S not used in the next production of the board B is the solder S to be reused.

When it is determined in step S3 that the expiration date of the solder S is near or when it is determined in step S4 that the state of the solder S is significantly changed, the solder S used in the current production of the board B cannot be reused. Therefore, in these cases, the solder S not used in the next production of the board B is on the mask M used in the current production of the board B, and the user is notified that the solder S not used in the next production of the board B is the solder S to be discarded.

Advantageous Effects of First Embodiment

According to the first embodiment, the following advantageous effects are achieved.

According to the first embodiment, as described above, the control device 9 is configured or programmed to determine whether or not the solder scooping unit 56 performs the collecting operation to collect the solder S on the mask M used in the current production of the board B when the mask M used in the current production of the board B is replaced with the mask M used in the next production of the board B. Accordingly, it is possible to determine whether or not the solder S on the mask M is collected according to the situation when the mask M is replaced, and thus the solder S collecting operation can be performed by the solder scooping unit 56 according to the situation when the mask M is replaced. Consequently, it is possible to provide the printing device 1 capable of appropriately controlling the solder scooping unit 56 according to the situation when the mask M is replaced.

According to the first embodiment, as described above, the controller 9 is configured or programmed to determine whether or not the collecting operation is performed based on whether or not the solder S used in the current production of the board B is used in the next production of the board B. Accordingly, the solder scooping unit 56 can be more appropriately controlled according to the situation of whether or not the solder S used in the current production of the board B is used in the next production of the board B.

According to the first embodiment, as described above, the control device 9 is configured or programmed to determine whether or not the solder S used in the current production of the board B is used in the next production of the board B based on the type of the solder S, the amount of solder S, the expiration date of the solder S, the state of the solder S, the length of the solder S, and the length of the squeegee 51. Accordingly, the situation of whether or not the solder S used in the current production of the board B is used in the next production of the board B can be appropriately determined based on the type of the solder S, the amount of solder S, the expiration date of the solder S, the state of the solder S, the length of the solder S, and the length of the squeegee 51.

According to the first embodiment, as described above, the collecting operation includes the operation of the solder scooping unit 56 to scoop and collect the solder S on the mask M used in the current production of the board B. Furthermore, the control device 9 is configured or programmed to determine that scooping and collecting the solder S on the mask M used in the current production of the board B as the collecting operation is not performed by the solder scooping unit 56 when the solder S used in the current production of the board B is not used in the next production of the board B. Accordingly, the solder scooping unit 56 does not scoop the solder S unnecessarily, and thus the time required to replace the mask M can be reduced accordingly.

According to the first embodiment, as described above, the control device 9 is configured or programmed to determine that scooping and collecting the solder S on the mask M used in the current production of the board B as the collecting operation is performed by the solder scooping unit 56 when the solder S used in the current production of the board B is used in the next production of the board B. Furthermore, the control device 9 is configured or programmed to control the solder scooping unit 56 to transfer the scooped solder S to the mask M used in the next production of the board B when determining that the collecting operation is performed. Accordingly, when the solder S needs to be transferred, the solder scooping unit 56 is appropriately controlled such that the solder S can be transferred from the mask M used in the current production of the board B to the mask M used in the next production of the board B.

According to the first embodiment, as described above, the printing device 1 includes the mask slider 55 configured to perform the replacement operation to replace the mask M used in the current production of the board B with the mask M used in the next production of the board B. Furthermore, the control device 9 is configured or programmed to determine whether or not the collecting operation is performed before the replacement operation is performed. Accordingly, whether or not the collecting operation is performed before the replacement operation is performed is determined such that the solder scooping unit 56 can be appropriately controlled according to the situation when the mask M is replaced.

According to the first embodiment, as described above, the control device 9 is configured or programmed to perform a control to notify the user that there is the solder S not used in the next production of the board B. Accordingly, the user can collect the solder S not used in the next production of the board B without forgetting the same.

According to the first embodiment, as described above, the control device 9 is configured or programmed to perform a control to notify the user that the solder S not used in the next production of the board B is the solder S to be reused or that the solder S not used in the next production of the board B is the solder S to be discarded in addition to that there is the solder S not used in the next production of the board B. Accordingly, the user can collect the solder S not used in the next production of the board B without forgetting the same and know whether the collected solder S is the solder S to be reused or the solder S to be discarded. Consequently, the user can easily and reliably perform the next operation on the collected solder S.

Modified Example of First Embodiment

A modified example of the first embodiment is now described with reference to FIGS. 5, 9A to 9F, and 10A and 10B. In the modified example, an example is described in which a user manually replaces a mask, unlike the aforementioned first embodiment in which the mask is automatically replaced by the mask slider.

A printing device 101 according to the modified example is different from the printing device 1 according to the first embodiment in that the printing device 101 does not include a mask replacement unit 7 and a mask slider 55. As shown in FIGS. 9A to 9F, a control device 109 (see FIG. 5) of the printing device 101 is configured or programmed to determine that scooping and collecting a solder S on a mask M used in the current production of a board B as collecting operation is performed by a solder scooping unit 56 when the solder S used in the current production of the board B is used in the next production of the board B. Furthermore, the control device 109 is configured or programmed to control the solder scooping unit 56 to perform the collecting operation and transfer the solder S scooped in the collecting operation to the mask M used in the next production of the board B. The control device 109 is an example of a "controller" in the claims.

Figure 9A:
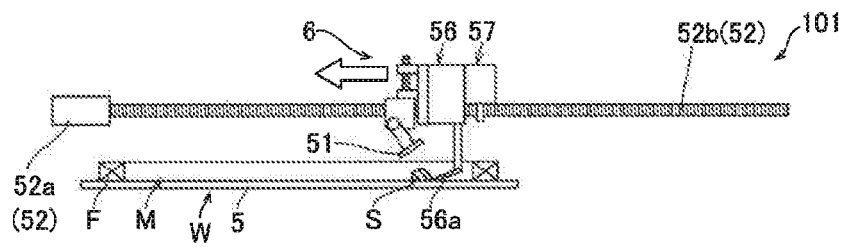
FIG. 9A to FIG. 9F are schematic views showing operation in a case in which collecting operation is performed in a printing device according to a modified example of the first embodiment.
Figure 9B:
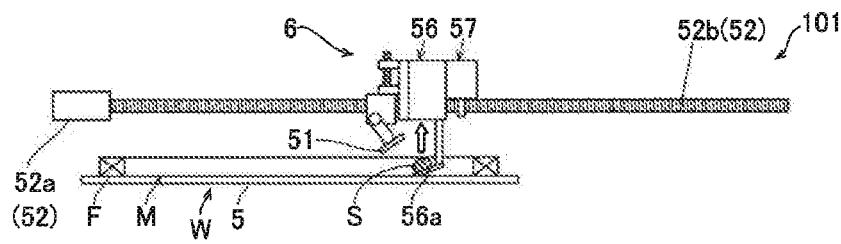
Figure 9C:
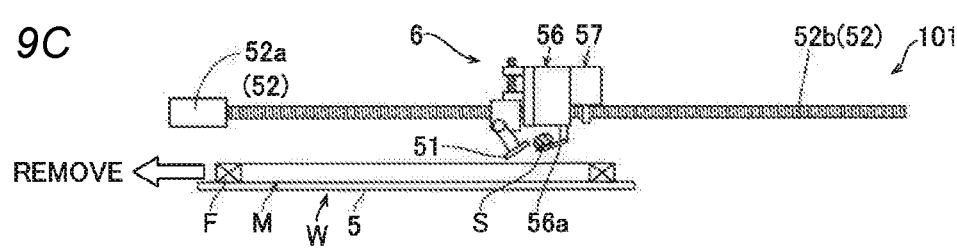

As shown in FIG. 9A, the control device 109 controls the solder scooping unit 56 to lower a scoop 56a of the solder scooping unit 56 to a lowered position on the mask M used in the current production of the board B, which is arranged in an operation position W. Then, as shown in FIG. 9B, the control device 109 controls the solder scooping unit 56 to move in a Y2 direction (a direction in which the solder S is scooped) in a state in which the scoop 56a is arranged in the lowered position. Thus, the solder S on the mask M used in the current production of the board B is moved and held on the scoop 56a of the solder scooping unit 56. Then, as shown in FIG. 9C, the control device 109 controls the solder scooping unit 56 to raise the scoop 56a of the solder scooping unit 56 that holds the solder S to a raised position. Thus, the solder scooping unit 56 scoops and collects the solder S on the mask M used in the current production of the board B. The user may be notified to replace the mask M after the collecting operation is completed.

Figure 9D:
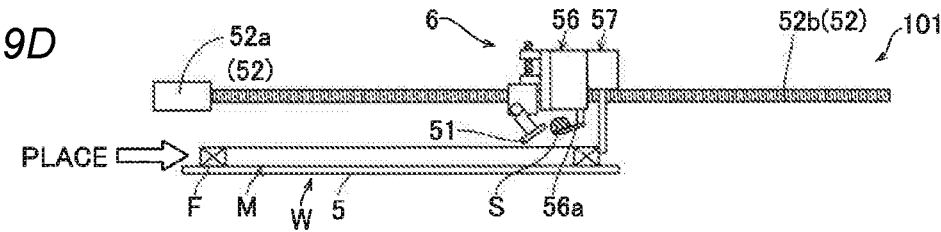

Then, as shown in FIG. 9C, the user removes the mask M used in the current production of the board B from the operation position W (mask clamp member 5) and moves the same to the outside of the printing device 101. Then, as shown in FIG. 9D, the user places the mask M used in the next production of the board B in the operation position W (mask clamp member 5) from the outside of the printing device 101. At this time, the control device 109 controls a mask position restricting unit 57 configured to restrict the position of the mask M such that the mask M used in the next production of the board B is arranged in the operation position W. Thus, the mask M used in the current production of the board B is replaced with the mask M used in the next production of the board B.

Figure 9E:
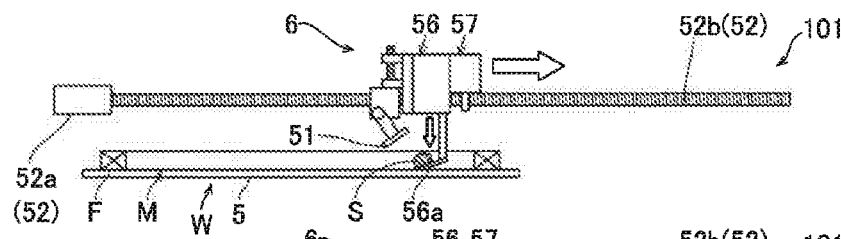
Figure 9F:
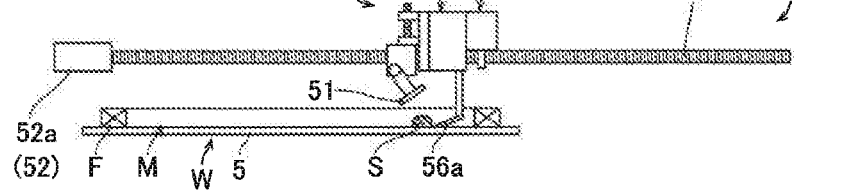

Then, as shown in FIG. 9E, the control device 109 controls the solder scooping unit 56 to lower the scoop 56a of the solder scooping unit 56 to the lowered position on the mask M used in the next production of the board B and arranged in the work position W. Then, as shown in FIG. 9F, the control device 109 controls the solder scooping unit 56 to move in a Y1 direction (a direction in which the solder S is unloaded) in a state in which the scoop 56a is arranged in the lowered position. Thus, the solder S on the scoop 56a of the solder scooping unit 56 is transferred onto the mask M used in the next production of the board B.

Figure 10A:
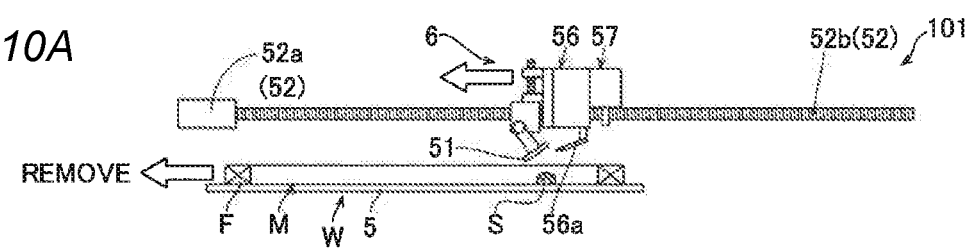
FIG. 10A and FIG. 10B are schematic views showing operation in a case in which the collecting operation is not performed in the printing device according to the modified example of the first embodiment.
Figure 10B:
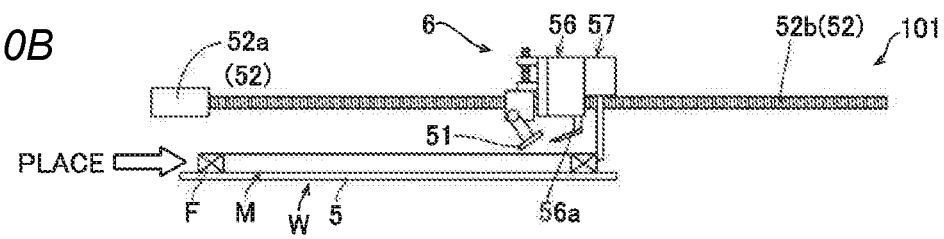

In the first embodiment, as shown in FIGS. 10A and 10B, the control device 109 is configured or programmed to determine that scooping and collecting the solder S on the mask M used in the current production of the board B as the collecting operation is not performed by the solder scooping unit 56 when the solder S used in the current production of the board B is not used in the next production of the board B. In this case, the control device 109 is configured or programmed to perform a control to notify the user that the solder S not used in the next production of the board B is the solder S to be reused or that the solder S not used in the next production of the board B is the solder S to be discarded in addition to that the solder S not used in the next production of the board B is on the mask M used in the current production of the board B. At this time, the control device 109 may perform a control to notify the user that the solder S used in the next production of the board B is prepared and replenished.

Upon receiving the notification, as shown in FIG. 10A, the user removes the mask M (the mask M with the solder S being arranged therein) used in the current production of the board B from the operation position W (mask clamp member 5) and moves the same to the outside the printing device 101. Then, as shown in FIG. 10B, the user places the mask M used in the next production of the board B in the operation position W (mask clamp member 5) from the outside of the printing device 101. At this time, the control device 109 controls the mask position restricting unit 57 configured to restrict the position of the mask M such that the mask M used in the next production of the board B is arranged in the operation position W. Thus, the mask M used in the current production of the board B is replaced with the mask M used in the next production of the board B.

The remaining structures of the modified example of the first embodiment are similar to those of the first embodiment.

Second Embodiment

A second embodiment of the present disclosure is now described with reference to FIGS. 1 to 3, 5, and 11A to 14. In the second embodiment, an example is described in which a printing device further includes a solder placement portion configured to enable a solder on a mask used in the current production of a board to be collected and allow the solder to be placed thereon, unlike the aforementioned first embodiment. The same or similar structures as those of the first embodiment are denoted by the same reference numerals, and description thereof is omitted.

Structure of Printing Device

As shown in FIGS. 5 and 11A to 13D, a printing device 201 (see FIGS. 1 to 3) according to the second embodiment is different from the printing device 1 according to the first embodiment in that the printing device 201 includes a control device 209 and a single solder placement portion 210 configured to enable a solder S on a mask used in the current production of a board B to be collected and allow the solder S to be placed thereon. The solder placement portion 210 includes a plate on which one or a plurality of solders S can be placed. The solder placement portion 210 is an example of a "coating material placement portion" in the claims. The control device 209 is an example of a "controller" in the claims.

In the second embodiment, collecting operation includes the operation of a solder scooping unit 56 to scoop the solder S on the mask M used in the current production of the board B and place the scooped solder S on the solder placement portion 210 to collect the solder S on the mask M used in the current production of the board B.

As shown in FIGS. 11A to 11G, the control device 209 is configured or programmed to determine that scooping the solder S on the mask M used in the current production of the board B and placing the scooped solder S on the solder placement portion 210 to collect the solder S on the mask M used in the current production of the board B, as the collecting operation is not performed by the solder scooping unit 56 when the solder S used in the current production of the board B is used in the next production of the board B. The control device 209 is also configured or programmed to control the solder scooping unit 56 to scoop the solder S on the mask M used in the current production of the board B and transfer the same to the mask M used in the next production of the board B without performing the collecting operation when determining that the collecting operation is not performed.

Figure 11A:
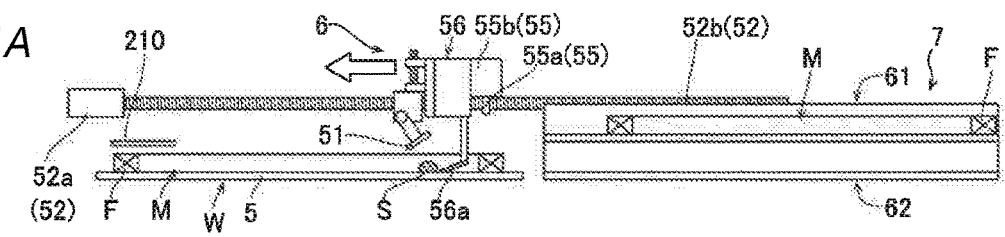
FIG. 11A to FIG. 11G are schematic views showing operation in a case in which collecting operation is not performed in a printing device according to a second embodiment.
Figure 11B:
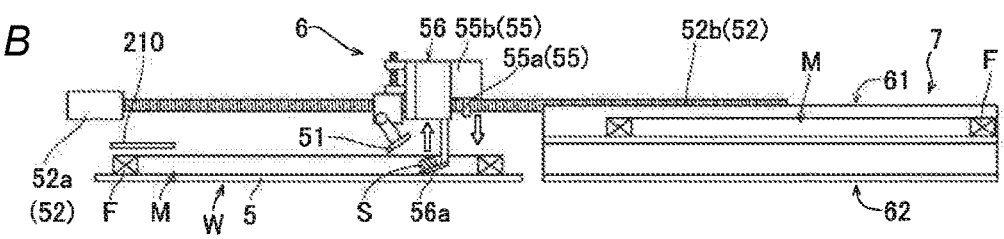
Figure 11C:
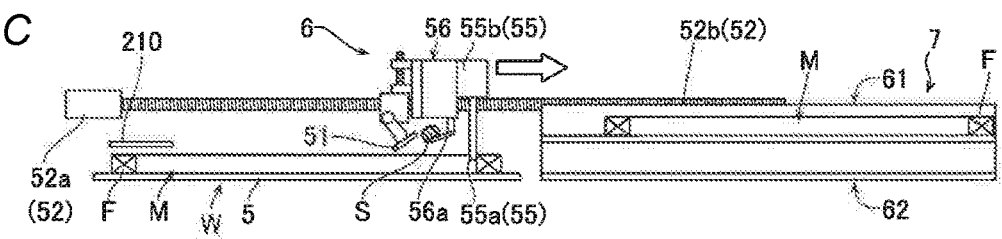

Specifically, first, as shown in FIG. 11A, the control device 209 controls the solder scooping unit 56 to lower a scoop 56a of the solder scooping unit 56 to a lowered position on the mask M used in the current production of the board B, which is arranged in an operation position W. Then, as shown in FIG. 11B, the control device 209 controls the solder scooping unit 56 to move in a Y2 direction (a direction in which the solder S is scooped) in a state in which the scoop 56a is arranged in the lowered position. Thus, the solder S on the mask M used in the current production of the board B is moved and held on the scoop 56a of the solder scooping unit 56. Then, as shown in FIG. 11C, the control device 209 controls the solder scooping unit 56 to raise the scoop 56a of the solder scooping unit 56 that holds the solder S to a raised position. Thus, the solder scooping unit 56 scoops the solder S on the mask M used in the current production of the board B.

Figure 11D:
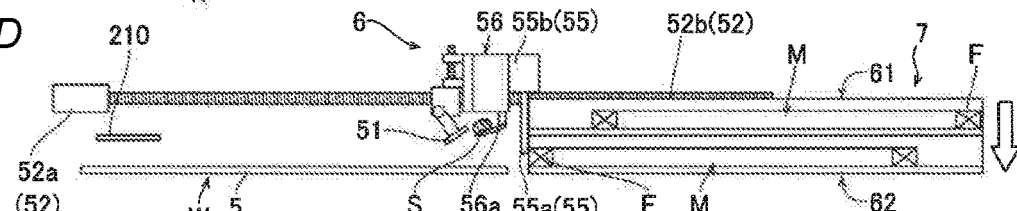
Figure 11E:
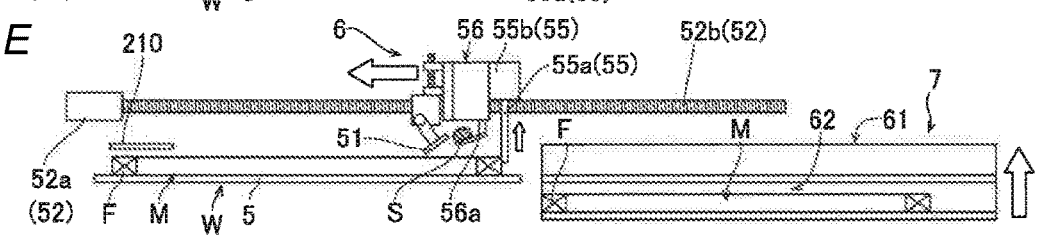

Then, as shown in FIGS. 11C and 11D, the control device 209 controls a mask slider 55 to move the mask M used in the current production of the board B from the operation position W (mask clamp member 5) to a second storage 62 of a mask replacement unit 7. When the mask M used in the current production of the board B is stored in the second storage 62, the control device 209 controls the mask replacement unit 7 to lower a first storage 61 and the second storage 62 of the mask replacement unit 7 to a lowered position. Then, as shown in FIG. 11E, the control device 209 controls the mask slider 55 to move the mask M used in the next production of the board B from the first storage 61 of the mask replacement unit 7 to the operation position W (mask clamp member 5). Thus, the mask M used in the current production of the board B is replaced with the mask M used in the next production of the board B.

Figure 11F:
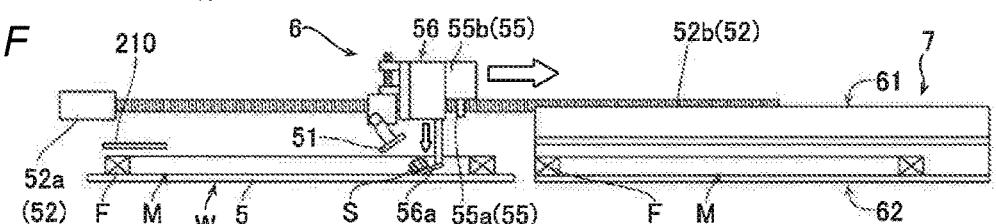
Figure 11G:
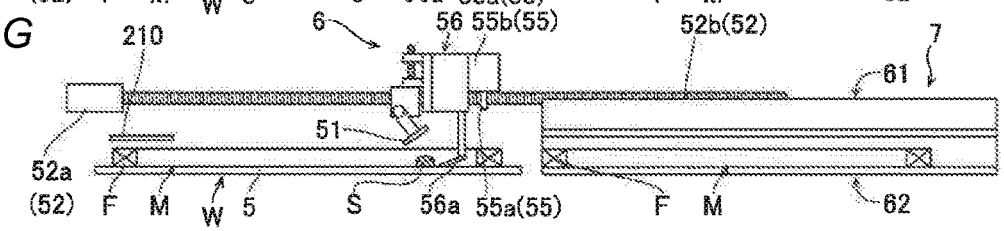

When the mask M used in the next production of the board B is arranged in the operation position W (mask clamp member 5), the control device 209 controls the mask replacement unit 7 to raise the first storage 61 and the second storage 62 of the mask replacement unit 7 to a raised position. Then, as shown in FIG. 11F, the control device 209 controls the solder scooping unit 56 to lower the scoop 56a of the solder scooping unit 56 to the lowered position on the mask M used in the next production of the board B arranged in the operation position W. Then, as shown in FIG. 11G, the control device 209 controls the solder scooping unit 56 to move in a Y1 direction (a direction in which the solder S is unloaded) in a state in which the scoop 56a is arranged in the lowered position. Thus, the solder S on the scoop 56a of the solder scooping unit 56 is transferred onto the mask M used in the next production of the board B.

In the second embodiment, as shown in FIGS. 12A to 12G, the control device 209 is configured or programmed to determine that scooping the solder S on the mask M used in the current production of the board B and placing the scooped solder S on the solder placement portion 210 to collect the solder S on the mask M used in the current production of the board B, as the collecting operation is performed by the solder scooping unit 56 when the solder S used in the current production of the board B is not used in the next production of the board B. In this case, the control device 209 controls the solder scooping unit 56 to scoop the solder S on the mask M used in the current production of the board B and place the scooped solder S on the solder placement portion 210 to collect the solder S on the mask M used in the current production of the board B.

The operation shown in FIGS. 12A to 12E is the same as the operation shown in FIGS. 11A to 11E, and thus detailed description thereof is omitted. As shown in FIG. 12F, after mask replacement operation, the control device 209 controls the solder scooping unit 56 to lower the scoop 56a onto the solder placement portion 210. Then, as shown in FIG. 12G, the control device 209 controls the solder scooping unit 56 to move in the Y1 direction (the direction in which the solder S is unloaded) in a state in which the scoop 56a is arranged on the solder placement portion 210. Thus, the solder S on the scoop 56a of the solder scooping unit 56 is placed on the solder placement portion 210 and collected.

In the second embodiment, the control device 209 is configured or programmed to control a storage 9b to store information that the solder S not used in the next production of the board B is on the solder placement portion 210 when the collecting operation is performed. Furthermore, the control device 209 is configured or programmed to perform a control to notify a user (operator) that the solder S not used in the next production of the board B is on the solder placement portion 210 based on the information stored in the storage 9b. At this time, the control device 209 is configured or programmed to perform a control to notify the user that the solder S not used in the next production of the board B is the solder S to be reused or that the solder S not used in the next production of the board B is the solder S to be discarded in addition to that the solder S not used in the next production of the board B is on the solder placement portion 210. When the solder S is placed on the solder placement portion 210 and collected, the position of the solder S placed on the solder placement portion 210 may be varied depending on whether the collected solder S is the solder S to be reused or the solder S to be discarded.

The control device 209 is configured or programmed to perform a control to notify the user of such information about the solder S when the user can collect the solder S, such as when the user opens a cover (not shown) of the printing device 201 or when the printing device 201 stops producing the board B. Based on the information of which the user is notified, the user collects the solder S on the solder placement portion 210, and stores the same for reuse or discards the same. The control device 209 is configured or programmed to perform a control to delete the information (the information that the solder S is on the solder placement portion 210) stored in the storage 9b when the user collects the solder S on the solder placement portion 210.

In the second embodiment, as shown in FIGS. 13A to 13D, the control device 209 is configured or programmed to control the solder scooping unit 56 to scoop and transfer, onto the mask M used in the production of the board B using the solder S on the solder placement portion 210, the solder S on the solder placement portion 210 when the production of the board B using the solder S on the solder placement portion 210 is performed.

Figure 13A:
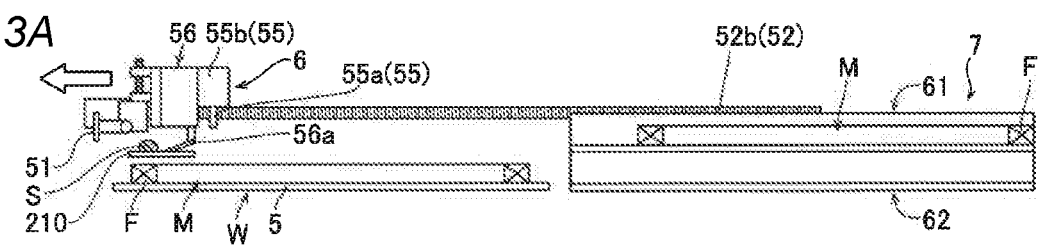
FIG. 13A to FIG. 13D are schematic views showing operation in a case in which a solder on a solder placement portion is reused in the printing device according to the second embodiment.
Figure 13B:
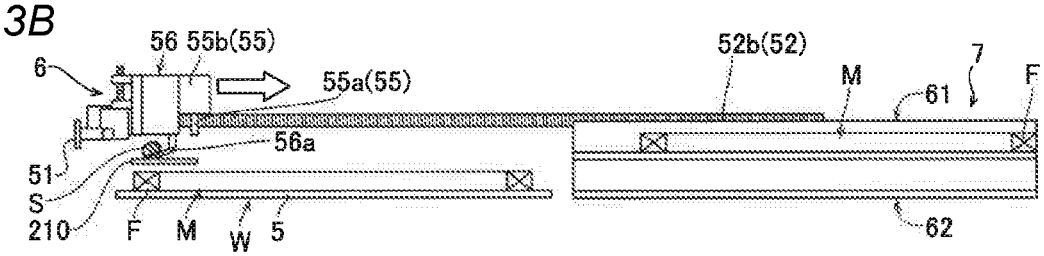
Figure 13C:
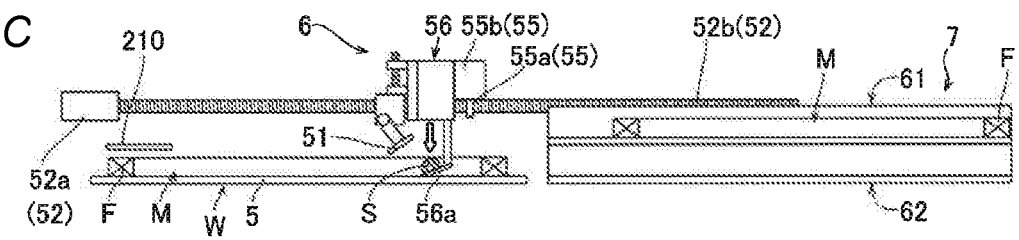
Figure 13D:
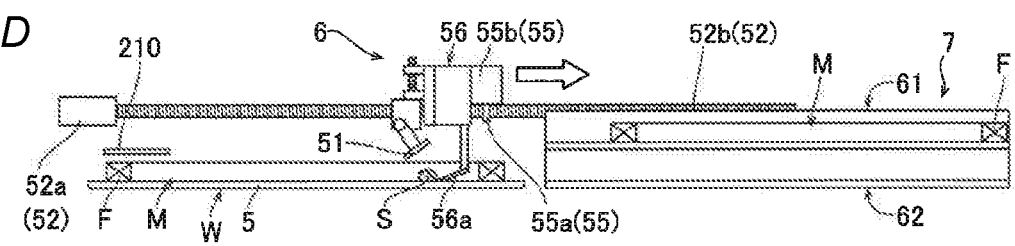

Specifically, first, as shown in FIG. 13A, the control device 209 controls the solder scooping unit 56 to lower the scoop 56a onto the solder placement portion 210. Then, as shown in FIG. 13B, the control device 209 controls the solder scooping unit 56 to move in the Y2 direction (the direction in which the solder S is scooped) in a state in which the scoop 56a is placed on the solder placement portion 210. Thus, the solder scooping unit 56 scoops the solder S on the solder placement portion 210. Then, as shown in FIG. 13C, the control device 209 controls the solder scooping unit 56 to lower the scoop 56a onto the mask M arranged in the operation position W. Then, as shown in FIG. 13D, the control device 209 controls the solder scooping unit 56 to move in the Y1 direction (the direction in which the solder S is unloaded) in a state in which the scoop 56a is arranged on the mask M arranged in the operation position W. Thus, the solder S on the scoop 56a of the solder scooping unit 56 is transferred onto the mask M used in the production of the board B using the solder S on the solder placement portion 210. When the expiration date of the solder S on the solder placement portion 210 has expired, the control device 209 does not control the solder scooping unit 56 to scoop and transfer, onto the mask M used in the production of the board B using the solder S on the solder placement portion 210, the solder S on the solder placement portion 210.

Solder Collection Determination Process

Figure 14:
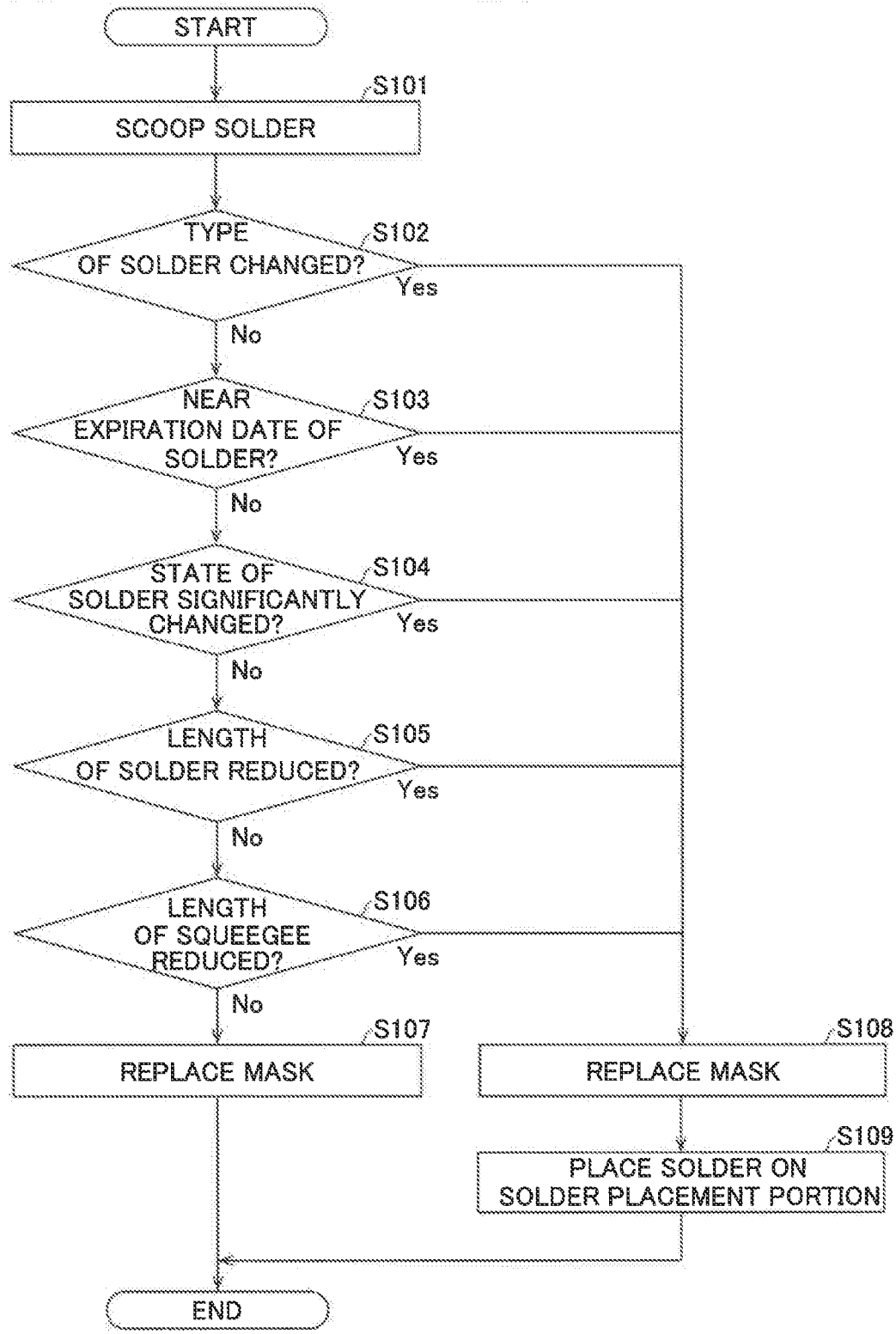
FIG. 14 is a flowchart for illustrating a solder collection determination process performed by the printing device according to the second embodiment.

A solder collection determination process performed by the printing device 201 according to the second embodiment is now described based on a flowchart with reference to FIG. 14. Each process operation of the flowchart is performed by the control device 209.

As shown in FIG. 14, first, in step S101, the solder scooping unit 56 scoops the solder S on the mask M used in the current production of the board B.

Then, in step S102, it is determined whether or not the type of the solder S is changed between the current production of the board B and the next production of the board B. When it is determined that the type of the solder S is not changed, the solder S on the mask M used in the current production of the board B can be used in the next production of the board B, and thus the process advances to step S103.

Then, in step S103, it is determined whether or not the expiration date of the solder S on the mask M used in the current production of the board B is near. When it is determined that the expiration date of the solder S is not near, the solder S on the mask M used in the current production of the board B can be used in the next production of the board B, and thus the process advances to step S104.

Then, in step S104, it is determined whether or not the state (such as the viscosity) of the solder S on the mask M used in the current production of the board B is significantly changed. When it is determined that the state of the solder S is not significantly changed, the solder S on the mask M used in the current production of the board B can be used in the next production of the board B, and thus the process advances to step S105.

Then, in step S105, it is determined whether or not the length of the solder S in the X direction is reduced between the current production of the board B and the next production of the board B. When it is determined that the length of the solder S in the X direction is not reduced, the solder S on the mask M used in the current production of the board B can be used in the next production of the board B, and thus the process advances to step S106.

Then, in step S106, it is determined whether or not the length of a squeegee 51 in the X direction is reduced between the current production of the board B and the next production of the board B. When it is determined that the length of the squeegee 51 in the X direction is not reduced, the solder S on the mask M used in the current production of the board B can be used in the next production of the board B, and thus the process advances to step S107.

Then, in step S107, the mask slider 55 replaces the mask M used in the current production of the board B with the mask M used in the next production of the board B.

After that, as operation to supply the solder S onto the mask M used in the next production of the board B, the solder S scooped by the solder scooping unit 56 in step S101 is transferred to the mask M used in the next production of the board B, and the solder collection determination process is terminated.

When it is determined in step S102 that the type of the solder S is changed, when it is determined in step S103 that the expiration date of the solder S is near, when it is determined in step S104 that the state of the solder S is significantly changed, when it is determined in step S105 that the length of the solder S in the X direction is reduced, or when it is determined in step S106 that the length of the squeegee 51 in the X direction is reduced, the solder S used in the current production of the board B is not used in the next production of the board B, and thus the process advances to step S108.

Then, in step S108, similarly to step S107, the mask slider 55 replaces the mask M used in the current production of the board B with the mask M used in the next production of the board B.

Then, in step S109, the solder scooping unit 56 places the solder S scooped in step S101 on the solder placement portion 210 and collects the same. Then, the solder collection determination process is terminated.

The remaining structures of the second embodiment are similar to those of the first embodiment.

Advantageous Effects of Second Embodiment

According to the second embodiment, the following advantageous effects are achieved.

According to the second embodiment, as described above, the controller 209 is configured or programmed to determine whether or not the collecting operation to collect the solder S on the mask M used in the current production of the board B is performed by the solder scooping unit 56 when the mask M used in the current production of the board B is replaced with the mask M used in the next production of the board B. Accordingly, it is possible to determine whether or not the solder S on the mask M is collected according to the situation when the mask M is replaced, and thus the solder S collecting operation can be performed by the solder scooping unit 56 according to the situation when the mask M is replaced. Consequently, it is possible to provide the printing device 201 capable of appropriately controlling the solder scooping unit 56 according to the situation when the mask M is replaced.

According to the second embodiment, as described above, the printing device 201 includes the solder placement portion 210 configured to enable the solder S on the mask M used in the current production of the board B to be collected and allow the solder S to be placed thereon. Furthermore, the collecting operation includes the operation of the solder scooping unit 56 to scoop the solder S on the mask M used in the current production of the board B and place the scooped solder S on the solder placement portion 210 to collect the solder S on the mask M used in the current production of the board B. In addition, the control device 209 is configured or programmed to determine that scooping the solder S on the mask M used in the current production of the board B and placing the scooped solder S on the solder placement portion 210 to collect the solder S on the mask M used in the current production of the board B, as the collecting operation is performed by the solder scooping unit 56 when the solder S used in the current production of the board B is not used in the next production of the board B. Accordingly, the solder S can be temporarily placed on the solder placement portion 210. Consequently, the temporarily placed solder S can be processed (a process to arrange the solder S on the mask M for reuse or a process to discard the solder S can be performed) at the desired timing.

According to the second embodiment, as described above, the control device 209 is configured or programmed to determine that scooping the solder S on the mask M used in the current production of the board B and placing the scooped solder S on the solder placement portion 210 to collect the solder S on the mask M used in the current production of the board B, as the collecting operation is not performed by the solder scooping unit 56 when the solder S used in the current production of the board B is used in the next production of the board B. Furthermore, the control device 209 is configured or programmed to control the solder scooping unit 56 to scoop and transfer, to the mask M used in the next production of the board B, the solder S on the mask M used in the current production of the board B when determining that the collecting operation is not performed. Accordingly, when the solder S needs to be transferred, the solder scooping unit 56 is appropriately controlled such that the solder S can be transferred from the mask M used in the current production of the board B to the mask M used in the next production of the board B.

According to the second embodiment, as described above, the control device 209 is configured or programmed to control the solder scooping unit 56 to scoop and transfer, onto the mask M used in the production of the board B using the solder S on the solder placement portion 210, the solder S on the solder placement portion 210 when the production of the board B using the solder S on the solder placement portion 210 is performed. Accordingly, when the solder S is reused, the solder S on the solder placement portion 210 can be automatically transferred onto the mask M by the solder scooping unit 56. Consequently, it is possible to save the user the trouble of manually transferring the solder S to be reused onto the mask M.

The remaining advantageous effects of the second embodiment are similar to those of the first embodiment.

Modified Example of Second Embodiment

A modified example of the second embodiment is now described with reference to FIGS. 5, 15A to 15F, and 16A to 16F. In the modified example, an example is described in which a user manually replaces a mask, unlike the aforementioned second embodiment in which the mask is automatically replaced by the mask slider.

A printing device 301 according to the modified example is different from the printing device 101 according to the second embodiment in that the printing device 301 does not include a mask replacement unit 7 and a mask slider 55. As shown in FIGS. 15A to 15F, a control device 309 (see FIG. 5) of the printing device 301 is configured or programmed to determine that scooping a solder S on a mask M used in the current production of a board B and placing the scooped solder S on a solder placement portion 210 to collect the solder S on the mask M used in the current production of the board B, as collecting operation is not performed by a solder scooping unit 56 when the solder S used in the current production of the board B is used in the next production of the board B. The control device 309 is also configured or programmed to control a solder scooping unit 56 to scoop the solder S on the mask M used in the current production of the board B and transfer the same to the mask M used in the next production of the board B without performing the collecting operation when determining that the collecting operation is not performed. The control device 309 is an example of a "controller" in the claims.

Figure 15A:
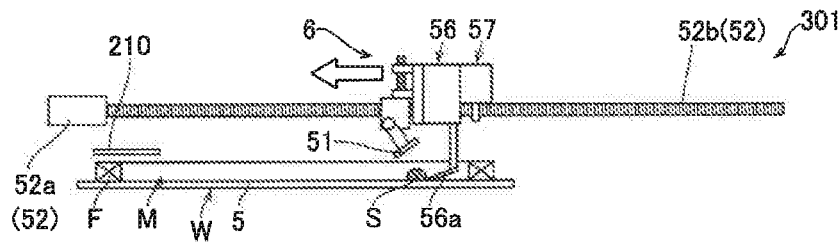
FIG. 15A to FIG. 15F are schematic views showing operation in a case in which collecting operation is not performed in a printing device according to a modified example of the second embodiment.
Figure 15B:
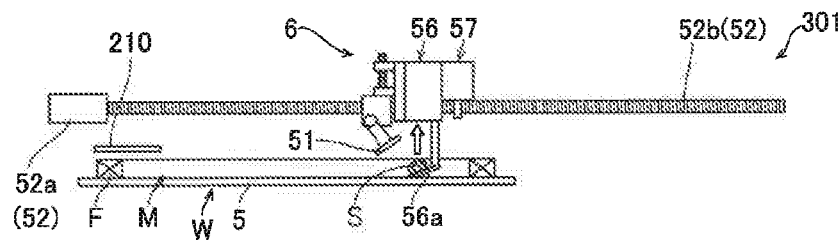
Figure 15C:
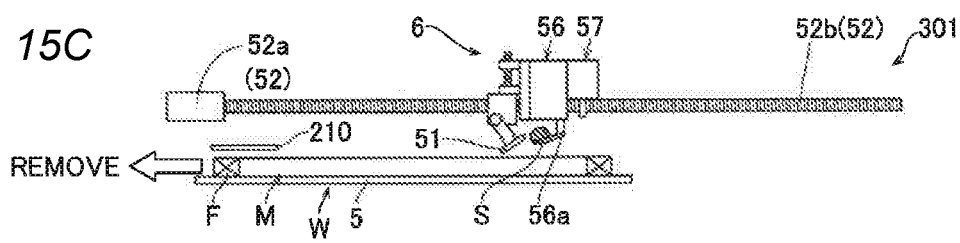

Specifically, first, as shown in FIG. 15A, the control device 309 controls the solder scooping unit 56 to lower a scoop 56a of the solder scooping unit 56 to a lowered position on the mask M used in the current production of the board B, which is arranged in an operation position W. Then, as shown in FIG. 15B, the control device 309 controls the solder scooping unit 56 to move in a Y2 direction (a direction in which the solder S is scooped) in a state in which the scoop 56a is arranged in the lowered position. Thus, the solder S on the mask M used in the current production of the board B is moved and held on the scoop 56a of the solder scooping unit 56. Then, as shown in FIG. 15C, the control device 309 controls the solder scooping unit 56 to raise the scoop 56a of the solder scooping unit 56 that holds the solder S to a raised position. Thus, the solder scooping unit 56 scoops the solder S on the mask M used in the current production of the board B. The user may be notified to replace the mask M after operation to scoop the solder S is completed.

Figure 15D:
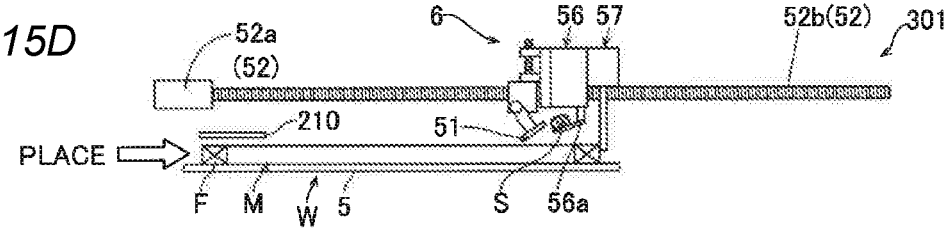

Then, as shown in FIG. 15C, the user removes the mask M used in the current production of the board B from the operation position W (mask clamp member 5) and moves the same to the outside of the printing device 301. Then, as shown in FIG. 15D, the user places the mask M used in the next production of the board B in the operation position W (mask clamp member 5) from the outside of the printing device 301. At this time, the control device 309 controls a mask position restricting unit 57 configured to restrict the position of the mask M such that the mask M used in the next production of the board B is arranged in the operation position W. Thus, the mask M used in the current production of the board B is replaced with the mask M used in the next production of the board B.

Figure 15E:
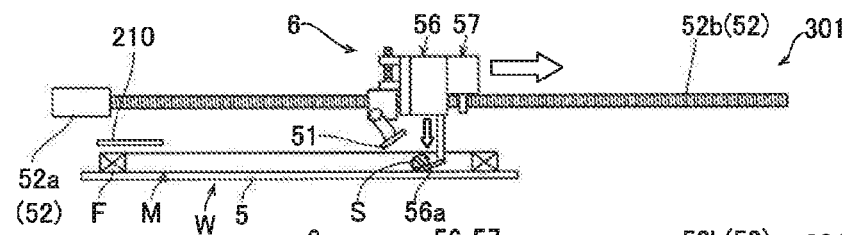
Figure 15F:
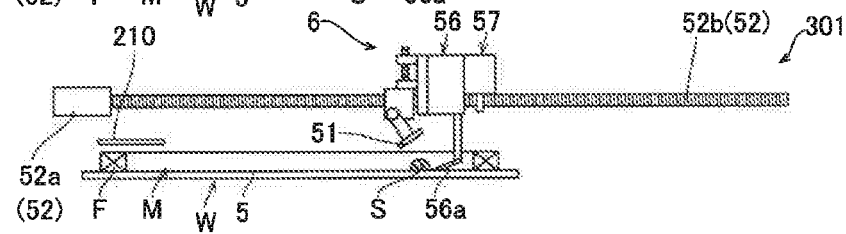

Then, as shown in FIG. 15E, the control device 309 controls the solder scooping unit 56 to lower the scoop 56a of the solder scooping unit 56 to the lowered position on the mask M used in the next production of the board B arranged in the operation position W. Then, as shown in FIG. 15F, the control device 309 controls the solder scooping unit 56 to move in a Y1 direction (a direction in which the solder S is unloaded) in a state in which the scoop 56a is arranged in the lowered position. Thus, the solder S on the scoop 56a of the solder scooping unit 56 is transferred onto the mask M used in the next production of the board B.

In the second embodiment, as shown in FIGS. 16A to 16F, the control device 309 is configured or programmed to determine that scooping the solder S on the mask M used in the current production of the board B and placing the scooped solder S on the solder placement portion 210 to collect the solder S on the mask M used in the current production of the board B, as the collecting operation is performed by the solder scooping unit 56 when the solder S used in the current production of the board B is not used in the next production of the board B. In this case, the control device 309 controls the solder scooping unit 56 to scoop the solder S on the mask M used in the current production of the board B and place the scooped solder S on the solder placement portion 210 to collect the solder S on the mask M used in the current production of the board B.

Figure 16A:
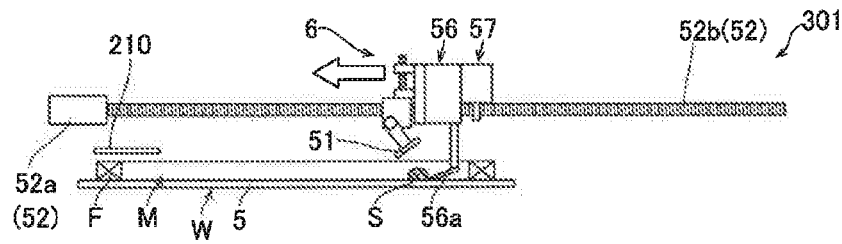
FIG. 16A to FIG. 16F are schematic views showing operation in a case in which the collecting operation is performed in the printing device according to the modified example of the second embodiment.
Figure 16B:
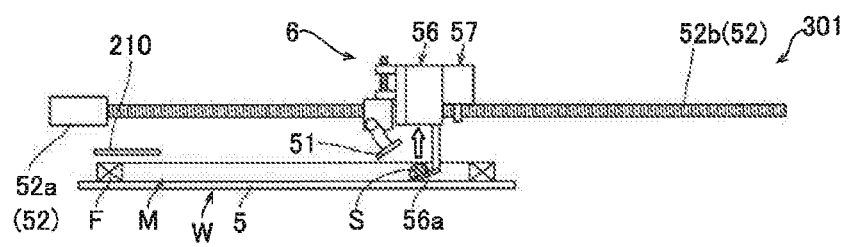
Figure 16C:
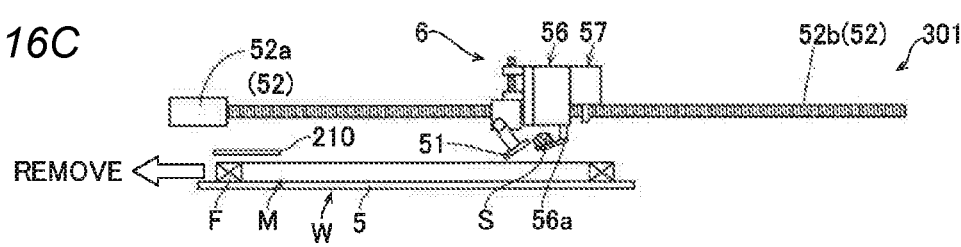
Figure 16D:
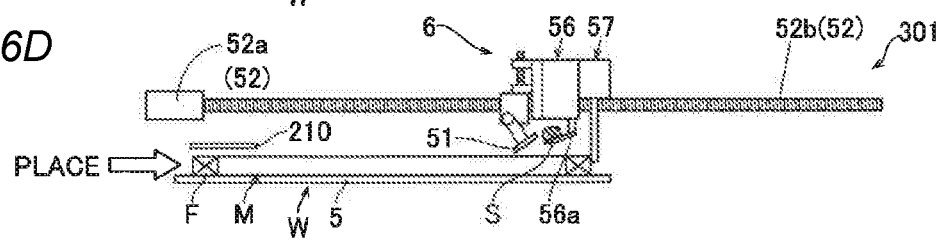
Figure 16E:
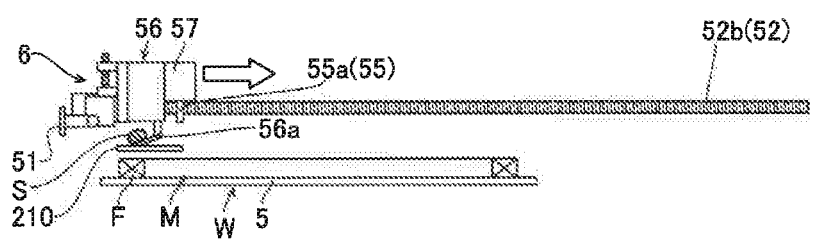
Figure 16F:
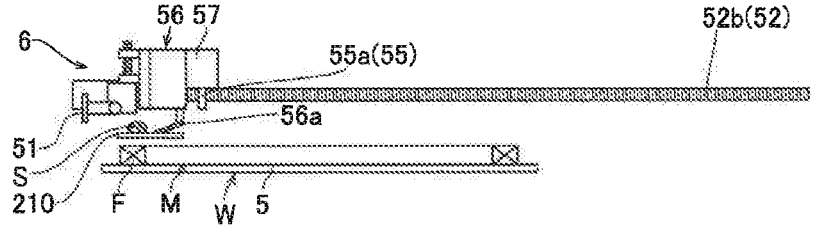

The operation shown in FIGS. 16A to 16D is the same as the operation shown in FIGS. 15A to 15D, and thus detailed description thereof is omitted. As shown in FIG. 16E, after the user replaces the mask, the control device 309 controls the solder scooping unit 56 to lower the scoop 56a onto the solder placement portion 210. Then, as shown in FIG. 16F, the control device 309 controls the solder scooping unit 56 to move in the Y1 direction (the direction in which the solder S is unloaded) in a state in which the scoop 56a is arranged on the solder placement portion 210. Thus, the solder S on the scoop 56a of the solder scooping unit 56 is placed on the solder placement portion 210 and collected.

The remaining structures of the modified example of the second embodiment are similar to those of the second embodiment.

Third Embodiment

A third embodiment of the present disclosure is now described with reference to FIGS. 1 to 3, 5, 17A to 17C, and 18A to 18G. In the third embodiment, an example is described in which a solder is sequentially printed on a board using a plurality of different masks, unlike the aforementioned first embodiment. The same or similar structures as those of the first embodiment are denoted by the same reference numerals, and description thereof is omitted.

Structure of Printing Device

As shown in FIG. 5, a printing device 401 (see FIGS. 1 to 3) according to the third embodiment is different from the printing device 1 according to the first embodiment in that the printing device 401 includes a control device 409. The control device 409 is an example of a "controller" in the claims.

Figure 17A:
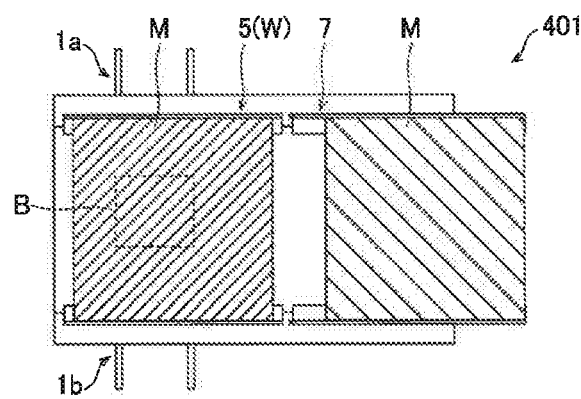
FIG. 17A to FIG. 17C are schematic views showing sequential printing operation in a printing device according to a third embodiment.
Figure 17B:
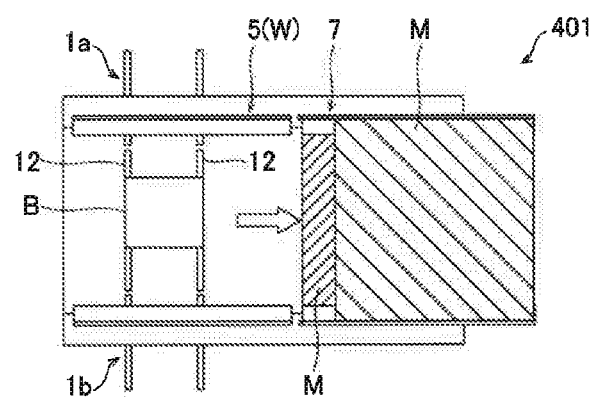
Figure 17C:
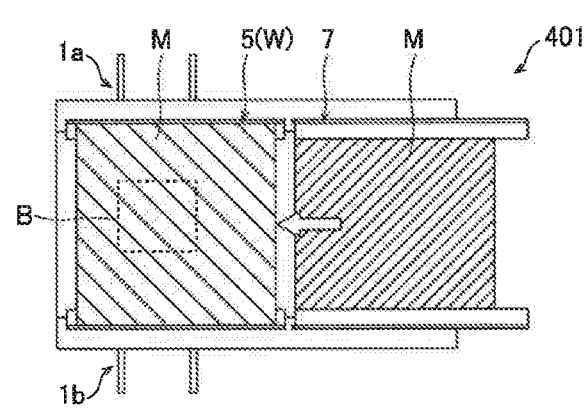

In the third embodiment, as shown in FIGS. 17A to 17C, the control device 409 is configured or programmed to perform a control to sequentially print a solder S on a single board B using each of a plurality of (two) different masks M when printing the solder S on the board B. Thus, for example, the solder S can be printed on the board B using the mask M for small components using the solder S having a small printing thickness and the mask M for large components using the solder S having a large printing thickness. Consequently, even when small components and large components are mixedly mounted on the board B, the solder S having a thickness suitable for small components and the solder S having a thickness suitable for large components can be printed on the board B.

The control device 409 is configured or programmed to perform a control to store, in a mask replacement unit 7, the mask M used in the first printing of the solder S on the board B, take out the mask M used in the second printing of the solder S on the board B from the mask replacement unit 7, and perform the second printing of the solder S on the board B in order to sequentially print the solder S on the single board B using each of the plurality of different masks M. As shown in FIGS. 18A to 18G, the control device 409 is configured or programmed to control a solder scooping unit 56 to scoop and transfer the solder S from the mask M used in the first printing of the solder S on the board B to the mask M used in the second printing of the solder S on the board B. FIGS. 18A to 18G show an example in which the mask M stored in a second storage 62 is the mask M used in the first printing of the solder S on the board B, and the mask M stored in a first storage 61 is the mask M used in the second printing of the solder S on the board B for the convenience of illustration.

Figure 18A:
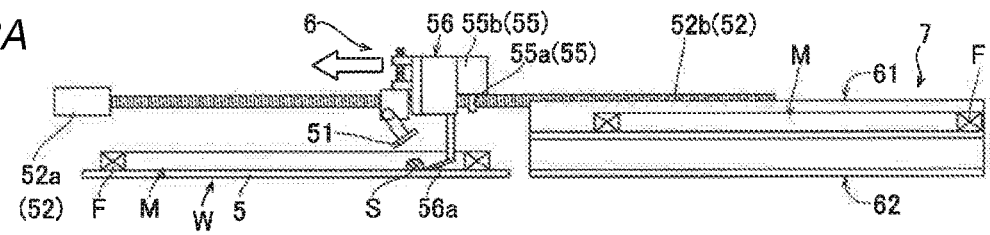
FIG. 18A to FIG. 18G are schematic views showing the sequential printing operation in the printing device according to the third embodiment.
Figure 18B:
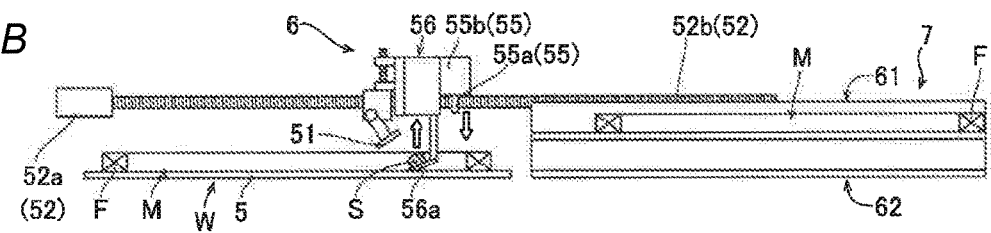
Figure 18C:
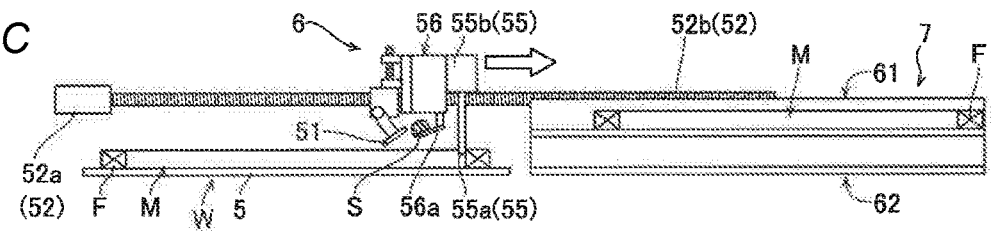

Specifically, first, as shown in FIG. 18A, when the first printing of the solder S on the board B is completed, the control device 409 controls the solder scooping unit 56 to lower a scoop 56a of the solder scooping unit 56 to a lowered position on the mask M used in the first printing of the solder S on the board B arranged in an operation position W. Then, as shown in FIG. 18B, the control device 409 controls the solder scooping unit 56 to move in a Y2 direction (a direction in which the solder S is scooped) in a state in which the scoop 56a is arranged in the lowered position. Thus, the solder S on the mask M used in the first printing of the solder S on the board B is moved and held on the scoop 56a of the solder scooping unit 56. Then, as shown in FIG. 18C, the control device 409 controls the solder scooping unit 56 to raise the scoop 56a of the solder scooping unit 56 that holds the solder S to a raised position. Thus, the solder scooping unit 56 scoops the solder S on the mask M used in the first printing of the solder S on the board B.

Figure 18D:
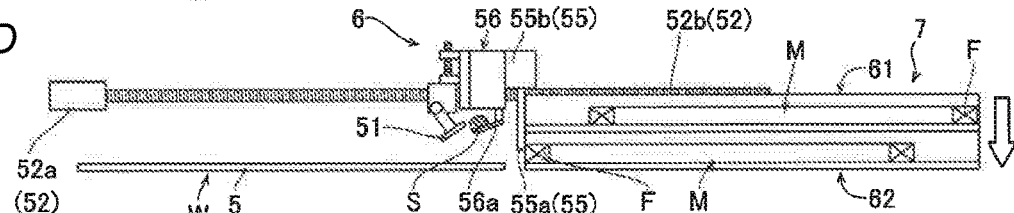
Figure 18E:
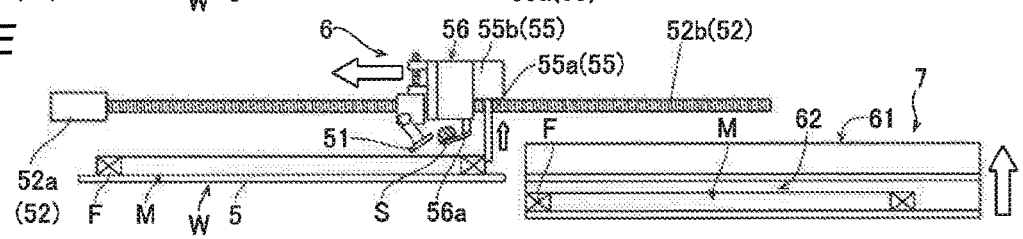

Then, as shown in FIGS. 18C and 18D, the control device 409 controls a mask slider 55 to move the mask M used in the first printing of the solder S on the board B from the operation position W (mask clamp member 5) to the second storage 62 of the mask replacement unit 7. Then, when the mask M used in the first printing of the solder S on the board B is stored in the second storage 62, the control device 409 controls the mask replacement unit 7 to lower the first storage 61 and the second storage 62 of the mask replacement unit 7 to a lowered position. Then, as shown in FIG. 18E, the control device 409 controls the mask slider 55 to move the mask M used in the second printing of the solder S on the board B from the first storage 61 of the mask replacement unit 7 to the operation position W (mask clamp member 5). Thus, the mask M used in the first printing of the solder S on the board B is replaced with the mask M used in the second printing of the solder S on the board B.

Figure 18F:
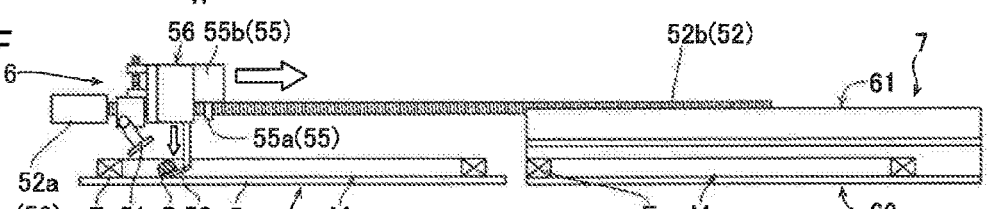
Figure 18G:
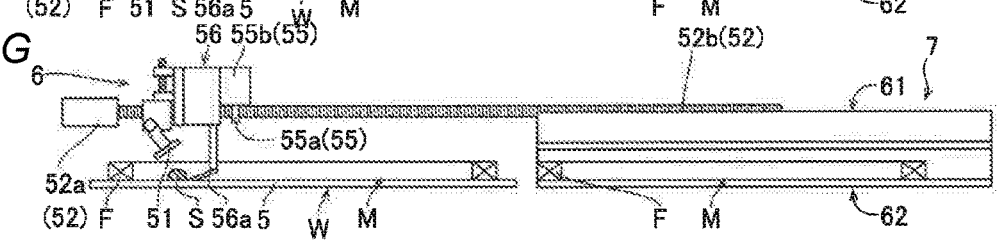

Then, when the mask M used in the second printing of the solder S on the board B is arranged in the operation position W (mask clamp member 5), the control device 409 controls the mask replacement unit 7 to raise the first storage 61 and the second storage 62 of the mask replacement unit 7 to a raised position. Then, as shown in FIG. 18F, the control device 409 controls the solder scooping unit 56 to lower the scoop 56a of the solder scooping unit 56 to the lowered position on the mask M used in the second printing of the solder S on the board B arranged in the operation position W. Then, as shown in FIG. 18G, the control device 409 controls the solder scooping unit 56 to move in a Y1 direction (a direction in which the solder S is unloaded) in a state in which the scoop 56a is arranged in the lowered position. Thus, the solder S on the scoop 56a of the solder scooping unit 56 is transferred onto the mask M used in the second printing of the solder S on the board B.

At this time, the control device 409 controls the solder scooping unit 56 to arrange and transfer the solder S onto the mask M used in the second printing of the solder S on the board B such that a printing direction in the second printing of the solder S on the board B is the same as a printing direction in the first printing (the Y1 direction, for example) of the solder S on the board B. The printing direction in the first printing of the solder S on the board B can be determined based on the orientation of a squeegee 51 after the first printing of the solder S on the board B.

The remaining structures of the third embodiment are similar to those of the first embodiment.

Advantageous Effects of Third Embodiment

According to the third embodiment, the following advantageous effects are achieved.

According to the third embodiment, as described above, the control device 409 is configured or programmed to perform a control to store, in the mask replacement unit 7, the mask M used in the first printing of the solder S on the board B after the first printing of the solder S on the board B, take out the mask M used in the second printing of the solder S on the board B from the mask replacement unit 7, and perform the second printing of the solder S on the board B in order to sequentially print the solder S on the single board B using each of the plurality of different masks M. Thus, sequential printing can be performed without using a plurality of printing devices. Consequently, an increase in the line length of a mounting line including the printing device can be significantly reduced or prevented even when the sequential printing is performed.

The remaining advantageous effects of the third embodiment are similar to those of the first embodiment.

Modified Examples

The embodiments disclosed this time must be considered as illustrative in all points and not restrictive. The scope of the present disclosure is not shown by the above description of the embodiments but by the scope of claims for patent, and all modifications (modified examples) within the meaning and scope equivalent to the scope of claims for patent are further included.

For example, while the example in which the control device (controller) is configured or programmed to determine whether or not the solder (coating material) used in the current production of the board is used in the next production of the board based on the type of the solder (coating material), the amount of solder (coating material), the expiration date of the solder (coating material), the state of the solder (coating material), and the length of the solder (coating material), and the length of the squeegee has been shown in each of the aforementioned first to third embodiments, the present disclosure is not restricted to this. In the present disclosure, the controller may be configured to determine whether or not the coating material used in the current production of the board is used in the next production of the board based on conditions other than the type of the coating material, the amount of coating material, the expiration date of the coating material, the state of the coating material, the length of the coating material, and the length of the squeegee.

While the example in which the mask replacement unit is configured to store two masks has been shown in each of the aforementioned first to third embodiments, the present disclosure is not restricted to this. In the present disclosure, the mask replacement unit may be configured to store three or more masks.

While the example in which the solder (coating material) is placed on the solder placement portion (coating material placement portion) and collected after mask replacement has been shown in the aforementioned second embodiment, the present disclosure is not restricted to this. In the present disclosure, before mask replacement, the coating material may be placed on the coating material placement portion and collected.

While the example in which a single solder replacement portion (coating material replacement portion) is provided has been shown in the aforementioned second embodiment, the present disclosure is not restricted to this. In the present disclosure, two or more coating material replacement portions may be provided.

While the process operations performed by the control device are described, using the flowchart described in a manner driven by a flow in which processes are performed in order along a process flow for the convenience of illustration in each of the aforementioned first and second embodiments, the present disclosure is not restricted to this. In the present disclosure, the process operations performed by the control device may be performed in an event-driven manner in which processes are performed on an event basis. In this case, the process operations may be performed in a complete event-driven manner or in a combination of an event-driven manner and a manner driven by a flow.

What is claimed is:

1. A printing device comprising:
   a squeegee configured to print, on a board, a coating material on a mask;
   a coating material scooping unit configured to scoop the coating material on the mask; and
   a controller configured or programmed to determine whether or not the coating material used in the current production of the board is the coating material that is to be reused and is not used in the next production of the board and determine whether or not the coating material scooping unit performs collecting operation to collect the coating material on the mask used in current production of the board when the mask used in the current production of the board is replaced with the mask used in next production of the board based on whether or not the coating material used in the current production of the board is the coating material that is to be reused and that is not used in the next production of the board.

2. The printing device according to claim 1, wherein
the controller is configured or programmed to determine whether or not the collecting operation is performed based on whether or not the coating material used in the current production of the board is used in the next production of the board.

3. The printing device according to claim 2, wherein
the controller is configured or programmed to determine whether or not the coating material used in the current production of the board is used in the next production of the board based on at least one of a type of the coating material, an amount of the coating material, an expiration date of the coating material, a state of the coating material, a length of the coating material, or a length of the squeegee.

4. The printing device according to claim 3, wherein
the collecting operation includes operation of the coating material scooping unit to scoop and collect the coating material on the mask used in the current production of the board; and
the controller is configured or programmed to determine that scooping and collecting the coating material on the mask used in the current production of the board as the collecting operation is not performed by the coating material scooping unit when the coating material used in the current production of the board is not used in the next production of the board.

5. The printing device according to claim 3, further comprising:
   a coating material placement portion configured to enable the coating material on the mask used in the current production of the board to be collected and allow the coating material on the mask used in the current production of the board to be placed thereon; wherein
   the collecting operation includes operation of the coating material scooping unit to scoop the coating material on the mask used in the current production of the board and place, on the coating material placement portion, the coating material that has been scooped to collect the coating material on the mask used in the current production of the board; and
   the controller is configured or programmed to determine that scooping the coating material on the mask used in the current production of the board and placing, on the coating material placement portion, the coating material that has been scooped to collect the coating material on the mask used in the current production of the board as the collecting operation is performed by the coating material scooping unit when the coating material used in the current production of the board is not used in the next production of the board.

6. The printing device according to claim 3, further comprising:
   a mask replacer configured to perform replacement operation to replace the mask used in the current production of the board with the mask used in the next production of the board; wherein
   the controller is configured or programmed to determine whether or not the collecting operation is performed before the replacement operation is performed.

7. The printing device according to claim 3, wherein
the controller is configured or programmed to perform a control to notify a user that there is the coating material that is not used in the next production of the board.

8. The printing device according to claim 2, wherein
the collecting operation includes operation of the coating material scooping unit to scoop and collect the coating material on the mask used in the current production of the board; and
the controller is configured or programmed to determine that scooping and collecting the coating material on the mask used in the current production of the board as the collecting operation is not performed by the coating material scooping unit when the coating material used in the current production of the board is not used in the next production of the board.

9. The printing device according to claim 8, wherein
the controller is configured or programmed to determine that scooping and collecting the coating material on the mask used in the current production of the board as the collecting operation is performed by the coating material scooping unit when the coating material used in the current production of the board is used in the next production of the board; and
the controller is configured or programmed to control the coating material scooping unit to transfer, to the mask used in the next production of the board, the coating material that has been scooped when determining that the collecting operation is performed.

10. The printing device according to claim 8, further comprising:
a mask replacer configured to perform replacement operation to replace the mask used in the current production of the board with the mask used in the next production of the board; wherein
the controller is configured or programmed to determine whether or not the collecting operation is performed before the replacement operation is performed.

11. The printing device according to claim 8, wherein
the controller is configured or programmed to perform a control to notify a user that there is the coating material that is not used in the next production of the board.

12. The printing device according to claim 2, further comprising:
a coating material placement portion configured to enable the coating material on the mask used in the current production of the board to be collected and allow the coating material on the mask used in the current production of the board to be placed thereon; wherein
the collecting operation includes operation of the coating material scooping unit to scoop the coating material on the mask used in the current production of the board and place, on the coating material placement portion, the coating material that has been scooped to collect the coating material on the mask used in the current production of the board; and
the controller is configured or programmed to determine that scooping the coating material on the mask used in the current production of the board and placing, on the coating material placement portion, the coating material that has been scooped to collect the coating material on the mask used in the current production of the board as the collecting operation is performed by the coating material scooping unit when the coating material used in the current production of the board is not used in the next production of the board.

13. The printing device according to claim 12, wherein
the controller is configured or programmed to determine that scooping the coating material on the mask used in the current production of the board and placing, on the coating material placement portion, the coating material that has been scooped to collect the coating material on the mask used in the current production of the board as the collecting operation is not performed by the coating material scooping unit when the coating material used in the current production of the board is used in the next production of the board; and
the controller is configured or programmed to control the coating material scooping unit to scoop and transfer, to the mask used in the next production of the board, the coating material on the mask used in the current production of the board when determining that the collecting operation is not performed.

14. The printing device according to claim 13, wherein
the controller is configured or programmed to control the coating material scooping unit to scoop and transfer, onto the mask used in production of the board using the coating material on the coating material placement portion, the coating material on the coating material placement portion when the production of the board using the coating material on the coating material placement portion is performed.

15. The printing device according to claim 12, wherein
the controller is configured or programmed to control the coating material scooping unit to scoop and transfer, onto the mask used in production of the board using the coating material on the coating material placement portion, the coating material on the coating material placement portion when the production of the board using the coating material on the coating material placement portion is performed.

16. The printing device according to claim 2, further comprising:
a mask replacer configured to perform replacement operation to replace the mask used in the current production of the board with the mask used in the next production of the board; wherein
the controller is configured or programmed to determine whether or not the collecting operation is performed before the replacement operation is performed.

17. The printing device according to claim 2, wherein
the controller is configured or programmed to perform a control to notify a user that there is the coating material that is not used in the next production of the board.

18. The printing device according to claim 1, further comprising:
a mask replacer configured to perform replacement operation to replace the mask used in the current production of the board with the mask used in the next production of the board; wherein
the controller is configured or programmed to determine whether or not the collecting operation is performed before the replacement operation is performed.

19. The printing device according to claim 1, wherein
the controller is configured or programmed to perform a control to notify a user that there is the coating material that is not used in the next production of the board.

20. The printing device according to claim 19, wherein
the controller is configured or programmed to perform a control to notify the user that the coating material that is not used in the next production of the board is the coating material to be reused or that the coating material that is not used in the next production of the board is the coating material to be discarded in addition to that there is the coating material that is not used in the next production of the board.

21. The printing device according to claim 1, wherein the controller is configured or programmed to determine whether or not the coating material used in the current production of the board corresponds to one of a following cases: a case of the coating material that is to be reused and is not used in the next production of the board, and a case of the coating material that is to be discarded and is not used in the next production of the board and determine whether or not the collecting operation is performed based on whether or not the coating material used in the current production of the board corresponds to one of following cases: a case of the coating material that is to be reused and that is not used in the next production of the board, and a case of the coating material that is to be discarded and that is not used in the next production of the board.

* * * * *